(12) United States Patent
Hara

(10) Patent No.: US 8,518,181 B2
(45) Date of Patent: Aug. 27, 2013

(54) FILM FORMING APPARATUS AND FILM FORMING METHOD

(75) Inventor: Masamichi Hara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 2017 days.

(21) Appl. No.: 11/198,193

(22) Filed: Aug. 8, 2005

(65) Prior Publication Data

US 2006/0032444 A1 Feb. 16, 2006

(30) Foreign Application Priority Data

Aug. 10, 2004 (JP) ................................. 2004-233170

(51) Int. Cl.
*C23C 16/455* (2006.01)
*C23C 16/00* (2006.01)

(52) U.S. Cl.
USPC ..................... 118/715; 118/726; 156/345.29

(58) Field of Classification Search
USPC .............................. 118/715, 726; 156/345.29
See application file for complete search history.

(56) References Cited

U.S. PATENT DOCUMENTS

| | | | | | |
|---|---|---|---|---|---|
| 4,516,527 | A | * | 5/1985 | Sugioka | 118/723 R |
| 5,186,120 | A | * | 2/1993 | Ohnishi et al. | 118/667 |
| 5,372,754 | A | * | 12/1994 | Ono | 261/142 |
| 5,451,258 | A | * | 9/1995 | Hillman et al. | 118/715 |
| 5,470,390 | A | * | 11/1995 | Nishikawa et al. | 118/719 |
| 5,879,459 | A | * | 3/1999 | Gadgil et al. | 118/715 |
| 5,966,499 | A | * | 10/1999 | Hinkle et al. | 392/388 |
| 5,989,345 | A | * | 11/1999 | Hatano | 118/715 |
| 6,174,377 | B1 | * | 1/2001 | Doering et al. | 118/729 |
| 6,387,185 | B2 | * | 5/2002 | Doering et al. | 118/729 |
| 6,660,096 | B2 | * | 12/2003 | Takeshita et al. | 118/726 |
| 7,141,095 | B2 | * | 11/2006 | Aitchison et al. | 95/273 |
| 2004/0089232 | A1 | * | 5/2004 | Sasaki et al. | 118/620 |
| 2004/0124131 | A1 | * | 7/2004 | Aitchison et al. | 210/252 |
| 2004/0261703 | A1 | * | 12/2004 | Kobrin et al. | 118/715 |

(Continued)

FOREIGN PATENT DOCUMENTS

| | | |
|---|---|---|
| JP | 3-30829 | 2/1991 |
| JP | 6-89873 | 3/1994 |

(Continued)

OTHER PUBLICATIONS

Office Action issued Jan. 25, 2011, in Japanese Patent Application No. 2004-233170 (with English-language Translation).

*Primary Examiner* — Jeffrie R Lund
(74) *Attorney, Agent, or Firm* — Oblon, Spivak, McClelland, Maier & Neustadt, L.L.P.

(57) ABSTRACT

A thin film formation apparatus that introduces, in a first operational phase thereof, a source gas into a processing vessel capable of being evacuated and accommodating a substrate to be processed, and forms a thin film on the substrate by causing a reaction in the introduced source gas. The apparatus comprises a source gas producing part producing the source gas by vaporizing a source material of solid or liquid, a source gas supplying path forwarding the source gas produced in the source gas producing part to the processing vessel, a first open/close valve provided on the source gas supplying path, the first open/close valve taking an opened state in the first operational phase, and a carrier gas supply part supplying a carrier gas to the source gas producing part such that the source gas fills a part of the source gas supplying path at an upstream side of the first open/close valve and the source gas producing part with a quantity exceeding a predetermined value, immediately before the first open/close valve becoming an opened state.

24 Claims, 14 Drawing Sheets

(56) References Cited

U.S. PATENT DOCUMENTS

| | | | |
|---|---|---|---|
| 2005/0081787 A1* | 4/2005 | Im et al. | 118/715 |
| 2005/0109277 A1* | 5/2005 | Kobrin et al. | 118/715 |
| 2006/0032444 A1* | 2/2006 | Hara | 118/715 |
| 2006/0141152 A1* | 6/2006 | Oh | 427/248.1 |
| 2006/0196421 A1* | 9/2006 | Ronsse et al. | 118/715 |
| 2006/0207503 A1* | 9/2006 | Meneghini et al. | 118/715 |
| 2006/0213441 A1* | 9/2006 | Kobrin et al. | 118/715 |
| 2007/0042119 A1* | 2/2007 | Matthysse et al. | 427/248.1 |
| 2007/0089674 A1* | 4/2007 | Aitchison et al. | 118/715 |

FOREIGN PATENT DOCUMENTS

| | | |
|---|---|---|
| JP | 7-150359 | 6/1995 |
| JP | 10-88349 | 4/1998 |
| JP | 10-168576 | 6/1998 |
| JP | 2001-514440 | 9/2001 |
| JP | 2002-151489 | 5/2002 |
| JP | 2004-22991 | 1/2004 |
| WO | WO 99/10558 | 3/1999 |

* cited by examiner

FILM FORMING APPARATUS AND FILM FORMING METHOD

BACKGROUND OF THE INVENTION

The present invention generally relates to film formation technology used for forming a thin film on a substrate by a reaction of a source gas in a depressurized processing vessel, and more particularly to a thin film formation apparatus that produces a source gas from a source material of solid state or liquid state and supplies the produced source gas to a processing vessel. Further, the present invention relates to a thin film formation method that uses such a film formation apparatus.

A CVD (chemical vapor deposition) process is a film formation process that introduces a source gas into a processing vessel accommodating therein a substrate to be processed and deposits a desired thin film on the substrate by utilizing a chemical reaction taking place on the substrate surface or in gas phase.

In many cases, the source gas used with a CVD process is formed by vaporizing a volatile compound of the element constituting the thin film either in a solid state or in a liquid state. Generally, this is made by causing vaporization of a volatile compound held in a source vessel as a source material, by introducing a carrier gas, typically an inert gas, into the source vessel. Thereby, there is provided an open/close valve or inlet valve in a source gas supply line connecting the source material vessel and the processing vessel, and the inlet valve is controlled such that it is opened only when the source gas is to be introduced into the processing vessel.

Meanwhile, an ALD (Atomic Layer Deposition) process draws attention these days as an important film formation technology of semiconductor device production (Patent Reference 1, for example). Especially, film formation of a barrier metal film used for an interconnection structure of semiconductor devices or film formation of a high dielectric constant film typically used for a gate insulation film of MOSFET or a capacitor insulation film of capacitor, is thought as the field in which application of ALD process is highly effective.

In an ALD process, the foregoing conductor film or insulator film is formed on a substrate to be processed such as a semiconductor wafer one atomic layer by one atomic layer, and thus, two reaction gases are supplied to a processing vessel intermittently and alternately with a period of several seconds while interposing a purging step therebetween. Contrary to this, it should be noted that other conventional gas phase growth process such as a CVD process supplies a reaction gas to the processing vessel continuously. As a result of the chemical reaction of the reaction gases taking place intermittently, there is formed a layer of one atomic layer thickness or one molecular layer thickness in each one cycle of the gas supply sequence. Further, by repeating the gas supply sequence in plural times and by controlling the number of repetitions, it is possible with the ALD process to control the thickness of the thin film formed on the substrate arbitrarily.

With conventional ALD process, the ALD apparatus has been constructed such that a part of the source gas supply line located at the upstream side of an inlet valve is connected to an evacuation part such as a vacuum pump, or the like, by way of an evacuation bypass line, for enabling the desired intermittent supply for the reaction gas of the major constituent element of the thin film, and hence the source gas, to the processing vessel. Thereby, an open/close valve or an evacuation valve provided in the evacuation bypass line for evacuation is controlled in a complementary mode or reverse mode with regard to the operation of the inlet valve. Thus, in the interval of introducing the source gas to the processing vessel, the inlet valve is opened and evacuation valve is closed. Further, during the interval in which the source gas is not introduced to the processing vessel, the inlet valve is closed and the evacuation valve is opened such that the source gas produced in the source vessel is discarded to an evacuation part through the evacuation bypass line.

(Patent Reference 1) Japanese Laid-Open Patent Application 6-089873 official gazette

SUMMARY OF THE INVENTION

It should be noted that the foregoing conventional operation of ALD apparatus of discarding the source gas produced by the source vessel to the evacuation part via the evacuation bypass line by opening the evacuation valve during the interval in which the inlet valve is closed as noted above, has been used to stabilize the flow of the source gas at the time the inlet valve is reopened for introducing the source gas into the processing vessel again. Thus, this approach merely adopts the technique used in the art of CVD that introduces a source gas to the processing vessel with a constant gas flow rate.

However, such an approach raises the problem of the source gas being wasted during the period in which it is not introduced into the processing vessel. This waste of the source material is no longer ignorable in the case of using expensive substance for the source material. Further, there arises another problem that, because the evacuation valve in the evacuation bypass line is opened and closed frequently with the same number as the inlet valve, the evacuation valve tends to show a short lifetime.

The present invention has been made in view of the problems of conventional technology noted above and it is the object of the present invention to provide a thin film formation apparatus capable of reducing the cost of film formation process by improving the consumption efficiency of the source gas at the time of supplying a source gas formed in a source vessel to a processing vessel intermittently, cyclically or continuously, and a thin film formation method.

Another object of the present invention is to provide a thin film formation apparatus and also a thin film formation method capable of decreasing the maintenance cost by decreasing the number of opening and closing operations of the open/close valves and reducing the wear of the valves for overall apparatus at the time of supplying the source gas to the processing vessel intermittently or cyclically from the source vessel.

In order to achieve the foregoing object, the present invention provides a thin film formation apparatus that introduces, in a first operational phase thereof, a predetermined source gas into a processing vessel capable of being evacuated and accommodating therein a substrate to be processed, and forming a thin film on said substrate by causing a reaction in said introduced source gas, comprising:

a source gas producing part producing said source gas by vaporizing a source material of solid or liquid;

a source gas supplying path forwarding said source gas produced in said source gas producing part to said processing vessel;

a first open/close valve provided on said source gas supplying path, said first open/close valve taking an opened state in said first operational phase; and a carrier gas supply part supplying a carrier gas to said source gas producing part such that said source gas fills a part of said source gas supplying path at an upstream side of said first open/close valve and said source gas producing part with a quantity exceeding a predetermined value, immediately before said first open/close valve becoming an opened state.

According to the foregoing construction, the source gas produced in the source gas producing part is not discarded to exhaust during the interval in which the first open/close valve is closed and the supply of the source gas to the processing vessel is interrupted but is stored or accumulated in a part of the source gas supplying path located at the upstream side of the first open/close valve and in the source gas producing part, such that the source gas is accumulated with a quantity exceeding the predetermined quantity needed for film formation by the time immediately before the first open/close valve being switched to an opened state. Thus, as soon as the first open/close valve is opened, the accumulated source gas is supplied to the processing vessel. Thereby, the source gas is introduced into the processing vessel with a quantity exceeding the amount needed for film formation during the interval in which the first open/close valve is in the opened state.

According to a preferred embodiment of the present invention, the carrier gas supplying part comprises: a carrier gas source supplying said carrier gas; a carrier gas supply path forwarding said carrier gas from said carrier gas source to said source gas producing part; and a second open/close valve provided to said carrier gas supply path. In this case, it is possible for the carrier gas supplying part to control the open/close operation of the second open/close valve in connection with the open/close operation of the first open/close valve. Preferably, the second open/close valve is switched from closed state to opened state almost simultaneously to the switching operation of the first open/close valve from closed state to opened state, and that the second open/close valve is switched from the opened state to the closed state after a predetermined time has elapsed from the switching of the first open/close valve from the closed state to the opened state. By keep opening the second open/close valve after the first open/close valve has been closed over a predetermined time, production of the source gas in the source vessel is continued and filling of the source gas is continued. Alternatively, the carrier gas supplying part may cause the open/close operation in the second open/close valve without synchronization with the open/close operation of the first open/close valve.

According to another preferred embodiment of the present invention, the carrier gas supplying part comprises: a carrier gas source supplying a carrier gas; a carrier gas supply path for supplying the carrier gas from this carrier gas source to the source gas producing part; and a flow rate control device provided to the carrier gas supply path. In this case, the carrier gas supplying part can operate the flow rate control such that the flow rate of the carrier gas is changed in relation to the open/close operation of the first open/close valve. Preferably, the flow rate control device decreases the flow rate of the carrier gas with a predetermined delay time at the time of switching of the first open/close valve from the opened state to the closed state such that the flow rate of the carrier gas is increased with a predetermined slope at the time of switching of the first open/close valve from closed state to opened state. Thereby, it becomes possible to fill the source gas produced in the source vessel during the foregoing predetermined delay time. Further, by increasing the flow rate of carrier gas with a predetermined slope, it is possible to resume formation or supplying of the source gas with stability. Further, it is possible to operate the flow rate control device such that the carrier gas supplying part controls the flow rate of the carrier gas independently to the open/close operation of the first open/close valve.

According to a preferred embodiment of the present invention, a first evacuation path is connected to the source gas supplying path for evacuation and a first pressure release unit is provided in the first evacuation path for releasing the source gas when the pressure inside the source gas supplying path has exceeded a predetermined value. According to such a construction, it is possible to maintain the pressure inside the source gas supplying path below a predetermined value by the operation of the first pressure release unit, and condensation (liquefaction or solidification) of the source gas is prevented.

Further, according to preferred embodiment of the present invention, a second evacuation path is connected to the carrier gas supply path for evacuation and a second pressure release unit is provided to the second evacuation path for releasing the carrier gas when the pressure inside the carrier gas supply path has exceeded a predetermined value. According to such a construction, it is possible to maintain the pressure inside the source vessel below a reference value by maintaining the pressure inside the carrier gas supply path below a predetermined value as a result of operation of the second pressure release unit. Thereby, condensation of the source gas inside source vessel inside or source gas supplying path is prevented.

According to a preferred embodiment of the present invention, the source gas producing part includes a source vessel accommodating therein a solid source material or liquid source material and causing communication between the carrier gas supply path and the source gas supplying path. In this case, the source material causes evaporation with bubbling by the carrier gas in the source vessel, and the source gas thus formed is forwarded to the source gas supplying path.

According to a preferred embodiment of the present invention, there is provided a fill-in capacity adjustment unit such that the fill-in capacity adjustment unit draws the source gas during the period in which the first open/close valve is in a closed state and discharges the source gas when the first open/close valve has become an opened state. With this construction, it is possible to adjust the fill-in quantity of the source gas as desired by the operation of the fill-in capacity adjustment unit.

According to a preferred embodiment of the present invention, a third evacuation path for evacuation is connected to the source gas supplying path and a third open/close valve is provided to the third evacuation path such that it is opened when discarding the source gas formed in the source gas producing part without supplying the same to the processing vessel. With the present invention, it is possible to maintain the third open/close valve in the closed state during the interval in which the first open/close valve is opened and closed for film formation processing in the processing vessel. Thereby, there is little wear in the third open/close valve and a long lifetime is secured.

Further, as an embodiment of the present invention, it is desirable to provide a heating part that heats the source gas supplying path for preventing condensation of the source gas.

Further, according to a preferred embodiment of the present invention, there is provided a sequence that repeats the first phase plural times with a predetermined time interval. Also, in a preferred embodiment, the source gas that has been introduced into the processing vessel in the first phase is absorbed on the substrate with a predetermined quantity.

According to a preferred embodiment of the present invention, there are further provided a purge gas supplying part for supplying a purge gas to the processing vessel for discharging the excess source gas with a second phase immediately after the first phase and a first reaction gas supplying part supplying a first reaction gas in a third phase immediately following the second phase to the processing vessel for causing reaction with the source gas that has been absorbed on the substrate. The foregoing purge gas supplying part can also supply a purge gas to the processing vessel for discharging the excess reaction gas in a fourth phase immediately after the third phase.

According to a preferred embodiment of the present invention, there is provided a second reaction gas supply part for supplying a second reaction gas reacting with the source gas to the processing vessel. Thereby, the first open/close valve is opened in a fifth phase and the source gas is introduced into the processing vessel from the source gas producing part. Further, the second reaction gas is introduced from the second reaction gas supply part simultaneously, wherein the second reaction gas thus introduced is caused to react with the first source gas.

In this fifth phase, it is possible to carry out a standard CVD film formation process. Preferably, there is provided a gas flow rate control unit controlling the flow rate of the carrier gas supplied to the source gas producing part from the carrier gas supplying part, such that the source gas is introduced to the processing vessel with a desired flow rate in this fifth phase. Preferably, this gas flow rate control unit comprises: a flow meter for measuring the flow rate of a mixture gas of the source gas and carrier gas flowing through the source gas supplying path; and a source gas flow rate processing part for obtaining a flow rate of the source gas flowing through the source gas supplying path from the flow rate measurement value from this flow meter and the value of the flow rate of the carrier gas supplied to the source gas producing part from the carrier gas supplying part.

With the present invention, it is possible to carry out the film formation processing by arbitrarily switching between a first film formation sequence formed of first through fourth phases and a second film formation sequence formed of the fifth phase.

It should be noted that the present invention provides a thin film formation method for forming a thin film on a substrate by introducing a source gas into a processing vessel capable of being depressurized and accommodating therein a substrate to be processed in a first phase of operation by and causing reaction in the source gas thus introduced, comprising:
  a first step of supplying a carrier gas to a source material of solid state or liquid state and causing vaporization in said source material;
  a second step of accumulating said source gas formed with said first step with a quantity exceeding a predetermined value until immediately before of said first phase; and
  a third step of supplying said source gas accumulated with the quantity exceeding said needed quantity to said processing vessel in said first phase.

According to the thin film formation method of the present invention, the source gas formed with the first step is not discarded to an evacuation system but accumulated during an interval in which supplying of the source gas to the processing vessel is interrupted such that there is caused accumulation with a quantity exceeding a needed quantity. Upon commencement of the first phase, the source gas thus accumulated is supplied to the processing vessel, and thus, the source gas is supplied into the processing vessel with the quantity exceeding the need quantity during the first phase.

According to the thin film formation apparatus and thin film formation method of the present invention, it is possible to improve the consumption efficiency of the source gas and reduce the cost film formation with the construction and function noted above at the time of supplying the source gas formed in the source vessel to the processing vessel intermittently, cyclically or continuously. Further, it is possible to reduce the number of times of opening and closing operation of the open/close valves for the whole apparatus, while this leads to reduction of wear and hence maintenance cost.

Other objects and further features of the present invention will become apparent from the following detailed description when read in conjunction with the attached drawings.

DETAILED DESCRIPTION OF THE PREFERRED EMBODIMENTS

Hereinafter, preferred embodiment of the present invention will be explained with reference to attached drawings.

Figure 1:
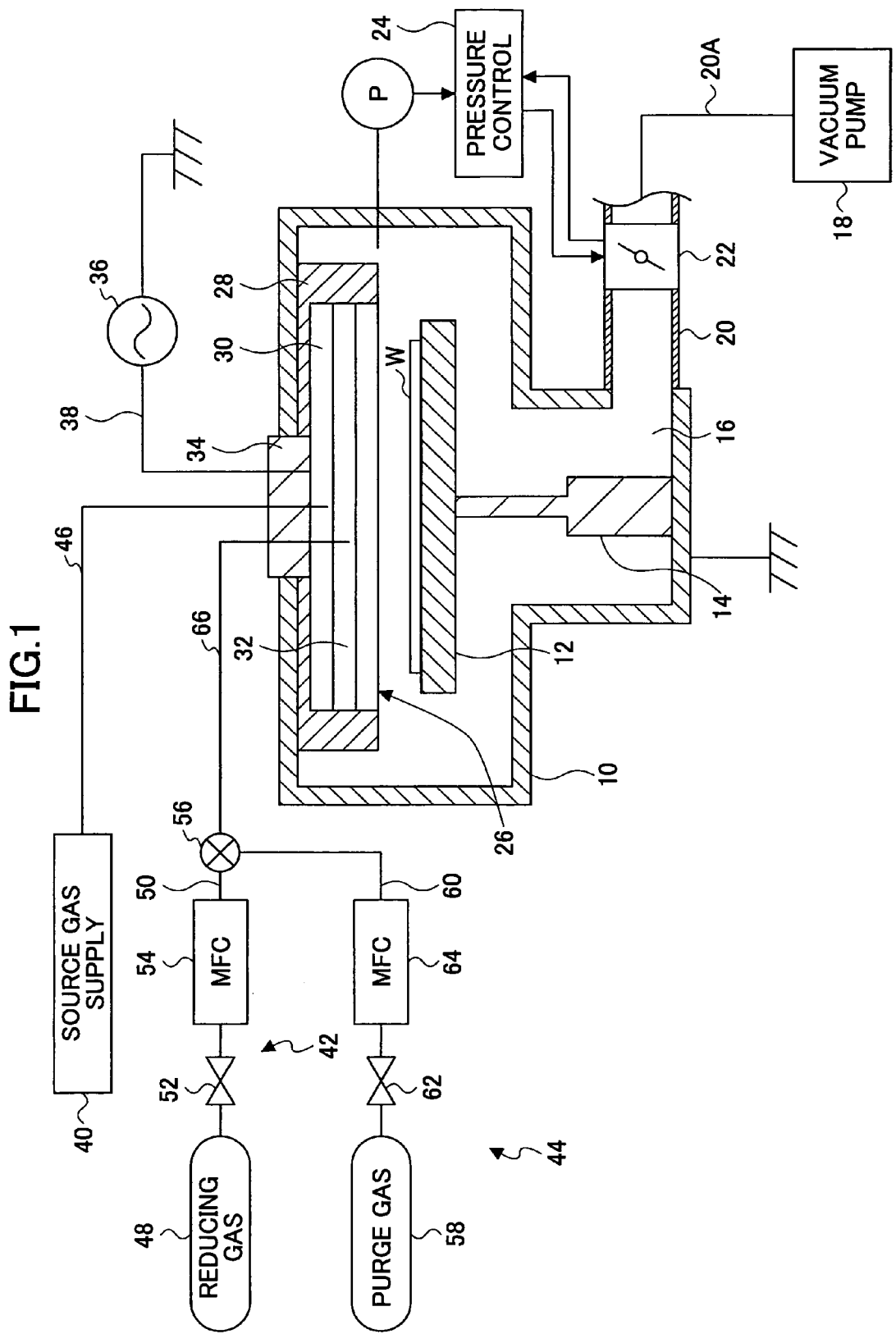
FIG. 1 is a block diagram showing the construction of an ALD apparatus according to a first embodiment of the present invention.

FIG. 1 shows a thin film formation apparatus according to an embodiment of the present invention. This thin film formation apparatus is constructed as an ALD apparatus that deposits a conductive film (a Ta film, for example) with an ALD process, while this apparatus is also capable of carrying out film formation processing according to a CVD process.

Referring to FIG. 1, the thin film formation apparatus of the present embodiment includes a processing vessel 10 of aluminum having an anodized aluminum surface or stainless steel and is grounded for safety reason. Further, a susceptor 12 is provided at a central part of the processing vessel 10 for supporting a semiconductor wafer W to be processed. This susceptor 12 is formed of a material having excellent resistance to corrosion and heat resistance such as Hastelloy (trademark), for example, and is supported horizontally by a support part 14 extending vertically in an upward direction from a bottom part of the processing vessel 10. Further, there is provided a built-in heater (not shown) within the susceptor 12 and the semiconductor wafer W can be heated to a desired temperature.

On the sidewall of the processing vessel 10, there is formed a substrate load/unload opening (not shown) such that the substrate load/unload opening is opened and closed by a gate valve (not shown), and an evacuation opening 16 is provided at the bottom part of the processing vessel 10. This evacuation opening 16 is connected to an evacuation conduit 20 connected to a vacuum evacuation part 18 and a conductance valve 22 is provided in the midway of the evacuation conduit 20, wherein the valve opening degree of the conductance valve 22 is controlled by a pressure control unit 24. The vacuum evacuation part 18 is formed for example by a vacuum pump such as a dry pump or turbo molecular pump. The pressure control unit 24 can switch between a pressure feed back control that controls the valve opening degree of the conductance valve 22 so as to coincide the pressure inside the processing vessel 10 to a preset pressure and a feed back control of the valve opening degree hold in which the valve opening degree of the conductance valve 22 is held to at a preset angle.

In the processing vessel 10, there is provided a shower head 26 of cylindrical form above the susceptor with a predetermined distance therefrom so as to function as a shower head and also as an upper electrode, wherein the surface of the shower head 26 other than the gas ejection surface (bottom surface), and thus, the side surface and top surface of the shower head 26 are provided with an insulative shielding material 28 such as quartz or ceramics such as $Al_2O_3$.

The shower head 26 has a double-decked structure in that there are provided a first gas introduction chamber 30 and a second gas introduction chamber 32 above and below in the shower head 26, and thus, it is possible to introduce two different reaction gases into a processing space inside the processing vessel 10 through respective, different gas introduction chambers.

Further, there is provided an opening on a top surface of the processing vessel 10, and a member 34 of an insulator is inserted into this opening, wherein a conductor 38 connected to a high frequency power supply 36 for plasma generation is inserted into this insulation member 34, and the conductor 38 is connected to an upper part of the shower head 26.

With such a construction, high frequency power produced form the high frequency power supply 36 with a predetermined output power is injected into the shower head 26 through the conductor 38, and a high frequency electric field for plasma formation with a parallel plate process is formed between the shower head 26 and the susceptor 12. In this embodiment, reactive species (ions and radicals) are formed by exciting a reducing gas with plasma according to a PEALD (Plasma Enhanced Atomic Layer Deposition) method as will be noted later.

This thin film formation apparatus is provided with a gas supply part for each of the gas species supplied to the processing vessel 10. In the case of depositing a Ta film used for the diffusion barrier film of Cu, for example, there are provided a source gas supplying part 40 for supplying vaporized $TaCl_5$ (tantalum pentachloride) as a source gas, a reducing gas supplying part 42 for supplying a $H_2$ gas as a reducing gas reducing $TaCl_5$, and a purge gas supplying part 44 that supplies an Ar gas or $N_2$ gas as a purge gas for purging excessive source gas or reducing gas inside the processing vessel 10.

Thereby, the source gas supplying part 40 is connected to the first gas introduction chamber 30 of the shower head 26 via a source gas supply line 46. The construction and function of the source gas supplying part 40 will be explained later. The reducing gas supplying part 42 includes a reducing gas source 48, an open/close valve 52 provided to the reducing gas supply line 50, a flow rate control device (MFC) 54, and a switching valve 56. The purge gas supplying part 44 includes a purge gas source 58, an open/close valve 62 provided to a purge gas supply line 60, a flow rate control device (MFC) 64, and a switching valve 56. The switching valve 56 connects either of the reducing gas supplying part 42 or the purge gas supplying part 44 to the second gas introduction chamber 32 of shower head 26 selectively via a common gas supply line 66.

Figure 2:
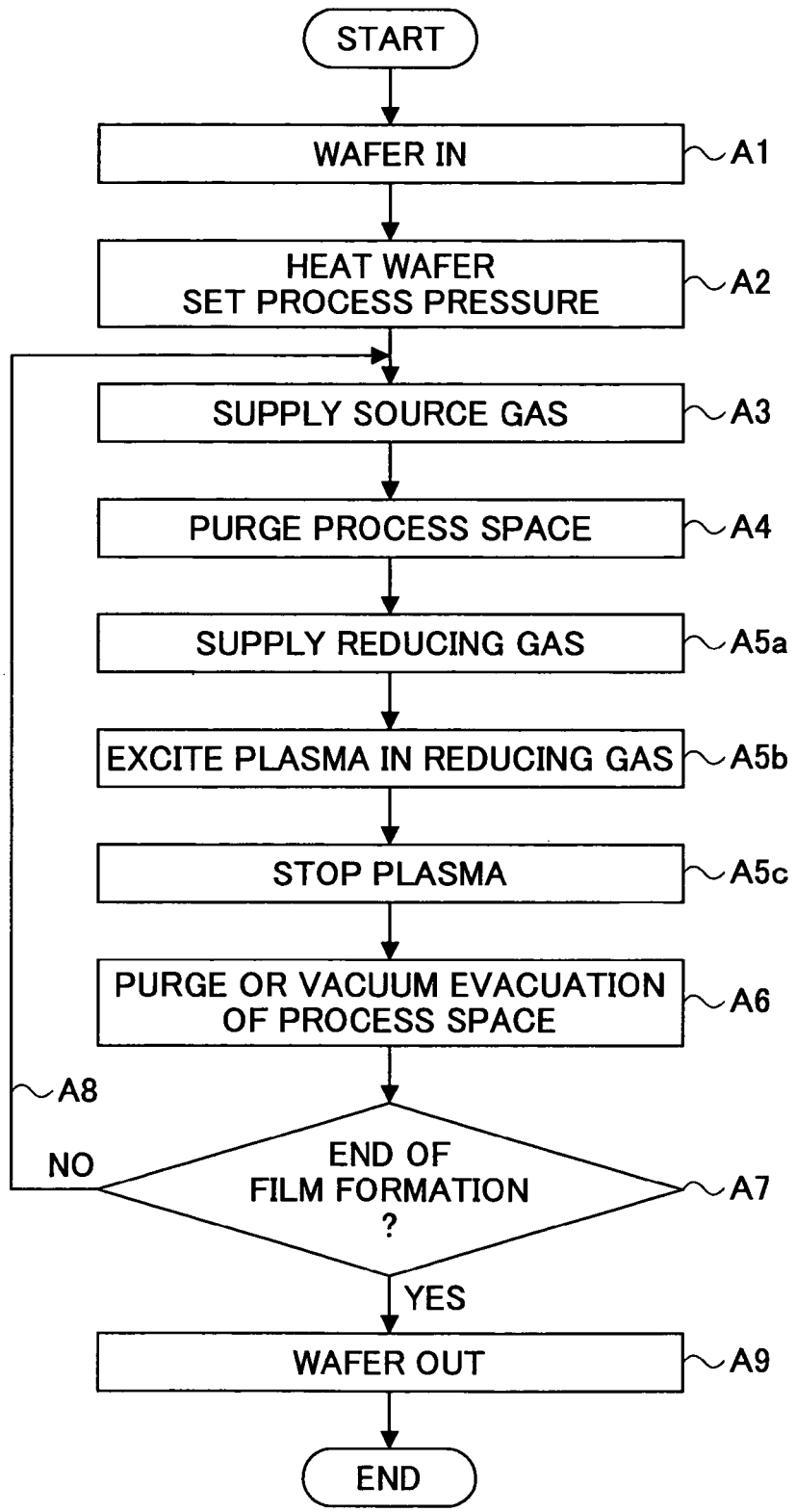
FIG. 2 is a flowchart showing the process sequence of a single-wafer ALD film formation processing according to an embodiment of the present invention.

Next, in accordance with the flowchart of FIG. 2, the operation of single-wafer ALD film formation processing in this thin film formation apparatus will be explained, wherein it should be noted that the operation of the apparatus is controlled by a main control unit (not shown) in accordance with a predetermined control program recorded on a computer-readable medium.

First, a semiconductor wafer is introduced into a processing vessel 10 as a substrate to be processed and placed on a susceptor 12 (Step A1).

Next, before starting an ALD film formation processing, the temperature of the semiconductor wafer on the susceptor is increased to a predetermined film formation temperature in a predetermined wafer temperature elevation interval.

During this wafer temperature elevation interval (preheat interval), the gas supply part (40,42,44) supplies a gas for predetermined pressure adjustment into the processing vessel 10 with a predetermined flow rate, and at the same time, the pressure control unit 24 performs the pressure feed back control and adjusts the valve opening degree of the conductance valve 22 (Step A2).

In the ALD processing interval, on the other hand, the same ALD cycle (step A3-A6) is repeated plural times (Step A7, A8). One ALD cycle basically comprises four phases: first step; second step, third step and fourth step (A3, A4, A5, S6).

In the first step A3, the source gas ($TaCl_5$ gas) is supplied to the processing vessel 10 from the source gas supplying part 40 together with the carrier gas, wherein the molecules of the source gas thus supplied cause absorption upon the semiconductor wafer W and there is formed a precursor of one molecule layer on the semiconductor wafer W.

In the second step A4, an inert gas is supplied to the processing vessel 10 from the purge gas supplying part 4 as a purge gas, and excessive source gas remaining in the processing vessel 10 without causing adsorption is discharged to outside of the vessel 10.

In the third step A5, a reducing gas ($H_2$ gas) is supplied into the processing vessel 10 at first from the reducing gas supplying part 42 (A5a). Here, in the case of PEALD, the high frequency power from the high frequency power supply 36 is applied across the upper electrode (shower head part) 26 and the lower electrode (susceptor) 12 and plasma is excited in the reducing gas ($H_2$ gas) in the processing vessel 10 (A5b). Thereby, the reactive species in the plasma (H radicals, H ions) cause a reducing reaction with the source gas molecules ($TaCl_5$) absorbed upon semiconductor wafer W in the form of atomic layer, and with this reduction reaction, there is grown a Ta thin film on the semiconductor wafer with one atomic layer thickness. Further, by terminating the plasma excitation after a predetermine time (A5c), the 3rd step (A5) is completed.

Next, in the fourth step A6, a purge gas is supplied into the processing vessel 10 from the purge gas supplying part 44, and excessive reducing gas and reactive species thereof remaining in the processing vessel 10 without causing reaction are discharged to the outside of the processing vessel 10.

In the case of PEALD process, the reducing gas reacts effectively with the source gas only when there is caused plasma excitation, and thus, it is possible to supply the reducing gas into the processing vessel 10 not only in the third step A5 but also in the first and second steps A3 and A4.

By repeating the ALD cycle (A3-A6) noted above for a predetermined number of times, it is determined that the thickness of the thin film on the semiconductor wafer W has reached a desired film thickness (Step A7), and the ALD film formation processing is terminated.

Next, the semiconductor wafer W thus processed is detached from the susceptor 12 and is carries out to the outside of the processing vessel 10 (Step A9).

Next, detailed construction and function of the source gas supplying part 40 of this embodiment will be explained.

Figure 3:
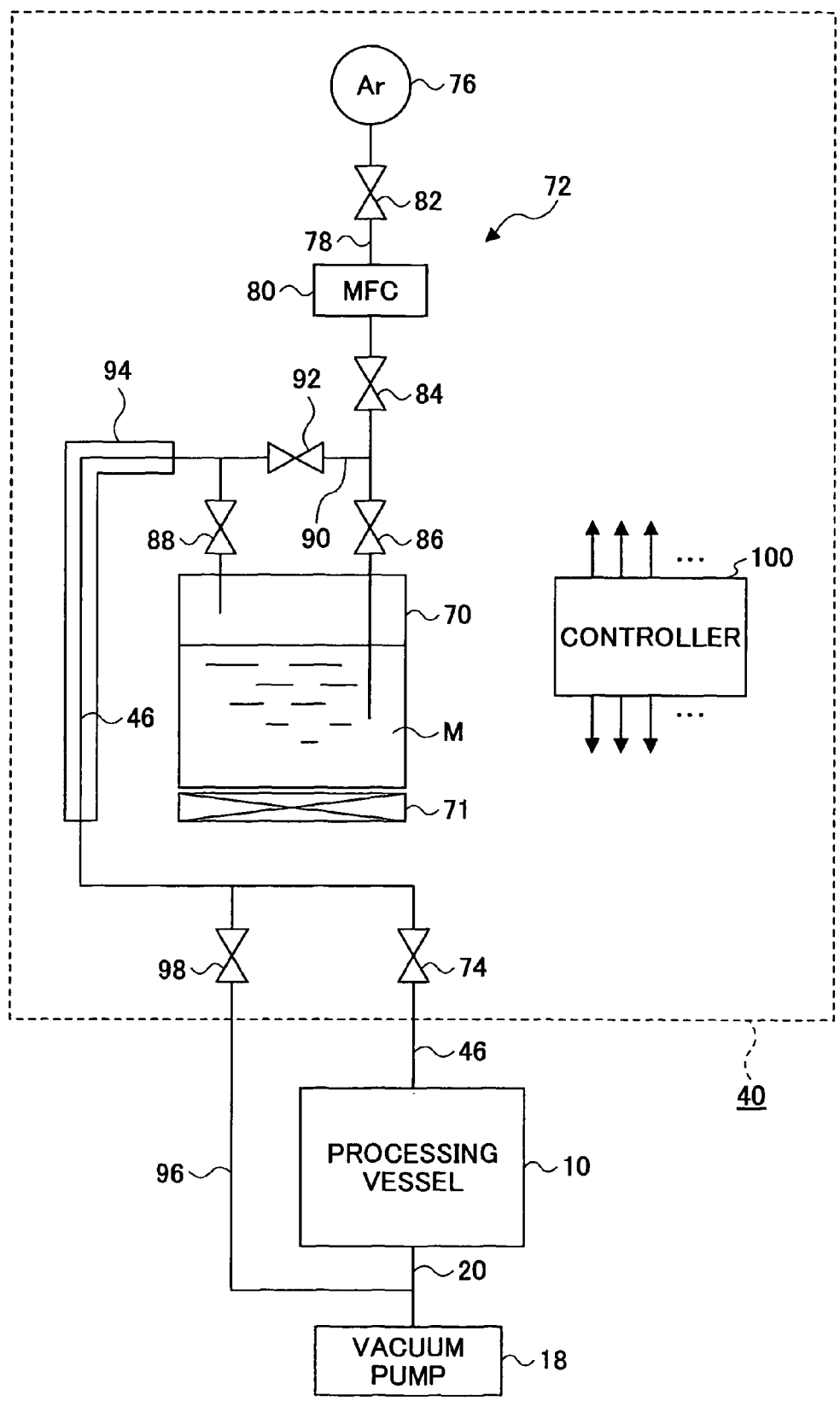
FIG. 3 is a diagram showing the construction of a source gas supply part according to an embodiment of the present invention.

FIG. 3 shows the construction of the source gas supplying part 40, wherein the source gas supplying part 40 comprises a source vessel (bubbler) 70 that accommodates therein a volatile solid source material or liquid source material M, a carrier gas supplying part 72 supplying the carrier gas, such as an Ar gas, to the source vessel 70, and an open/close valve 74 provided in the midway of the source gas supply line 46, which supplies the source gas formed in the source vessel 70 to the processing vessel 10, for introducing the source gas into the processing vessel 10.

In this embodiment, TaCl5 of powder state or granular state is accommodated in the source vessel 70 as the source material M, and a heater 71 is provided around the source vessel 70 for heating the source material M to a predetermined temperature.

The carrier gas supplying part 72 comprises: an Ar gas source 76 supplying an Ar gas; a carrier gas supply line 78 for supplying the Ar gas from the Ar gas source 76 to the source vessel 70; a flow rate control device (MFC) 80 provided in the midway of the carrier gas supply line 78; and the open/close valves 82, 84 and 86. Here, the open/close valve 82 is provided between the Ar gas source 76 and the flow rate control device (MFC) 80 while the open/close valves 84 and 86 are provided between the flow rate control device (MFC) 80 and the source vessel 70. Further, the tip of carrier gas supply line 78 is inserted into the source material M inside the source vessel 70.

The base end of the source gas supply line 46 is located over the source material held in the source vessel 70. Further, an open/close valve 88 is provided to the source gas supply line 46 in the outside thereof and in the vicinity of the source vessel 70. It should be noted that this valve 88 and the valve 86 located to at the downstream end of and carrier gas supplying part 72 are respectively the built-in exit valve and inlet valve of the source vessel 70. Further, an open/close valve 92 is provided in the bypass line 90 that connects the carrier gas supply line 78 and the source gas supply line 46.

Further, at least a part of the source gas supply line 46 located in the upstream side of the open/close valve 74 is heated to a constant temperature by using a coil heater 94, or the like, so as to avoid condensation (solidification or liquefaction) of the source gas. Further, the inlet valve 74 provided to the source gas supply line 46, the root valve 88, and the like, may be heated similarly.

Further, it should be noted that an evacuation bypass line 96 leading to the vacuum evacuation part 18 is connected to the part of the source gas supply line 46 at the upstream side of the open/close valve 74, wherein an open/close valve 98 for the evacuation is provided in the midway of the evacuation bypass line 96. These evacuation bypass line 96 and evacuation valve 98 may be heated to a constant temperature by a heater (not shown).

Figure 4:
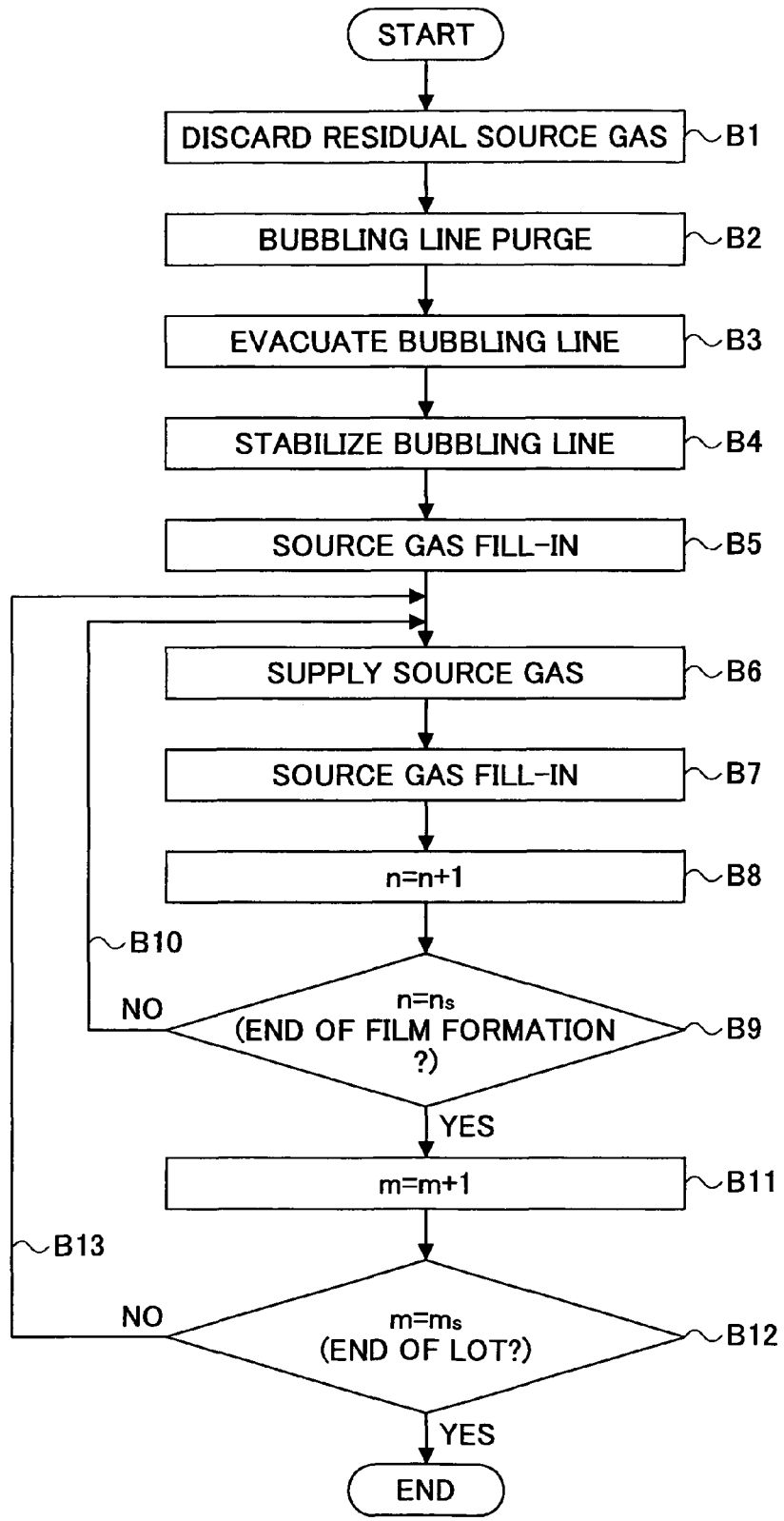
FIG. 4 is a flowchart showing the operational procedure of a source gas supply part according to an embodiment of the present invention.

FIG. 4 shows an example of operation of the source gas supplying part 40 of the present embodiment, wherein it should be noted that the illustrated operation is carried out when operating the ALD apparatus to process semiconductor wafers W of one lot unit (25 wafers, for example).

FIGS. 5-11 show the open/close state of each valve inside the source gas supplying part 40 in each of the steps of FIG. 4. Here, it should be noted that each part inside the source gas supplying part 40 is controlled by a controller 100.

First, vacuum evacuation process is conducted for evacuating the source gas (TaCl$_5$ gas) remaining in the source gas supplying part 40, especially the source vessel 70 and the source gas supply line 46 (Step B1).

Figure 5:
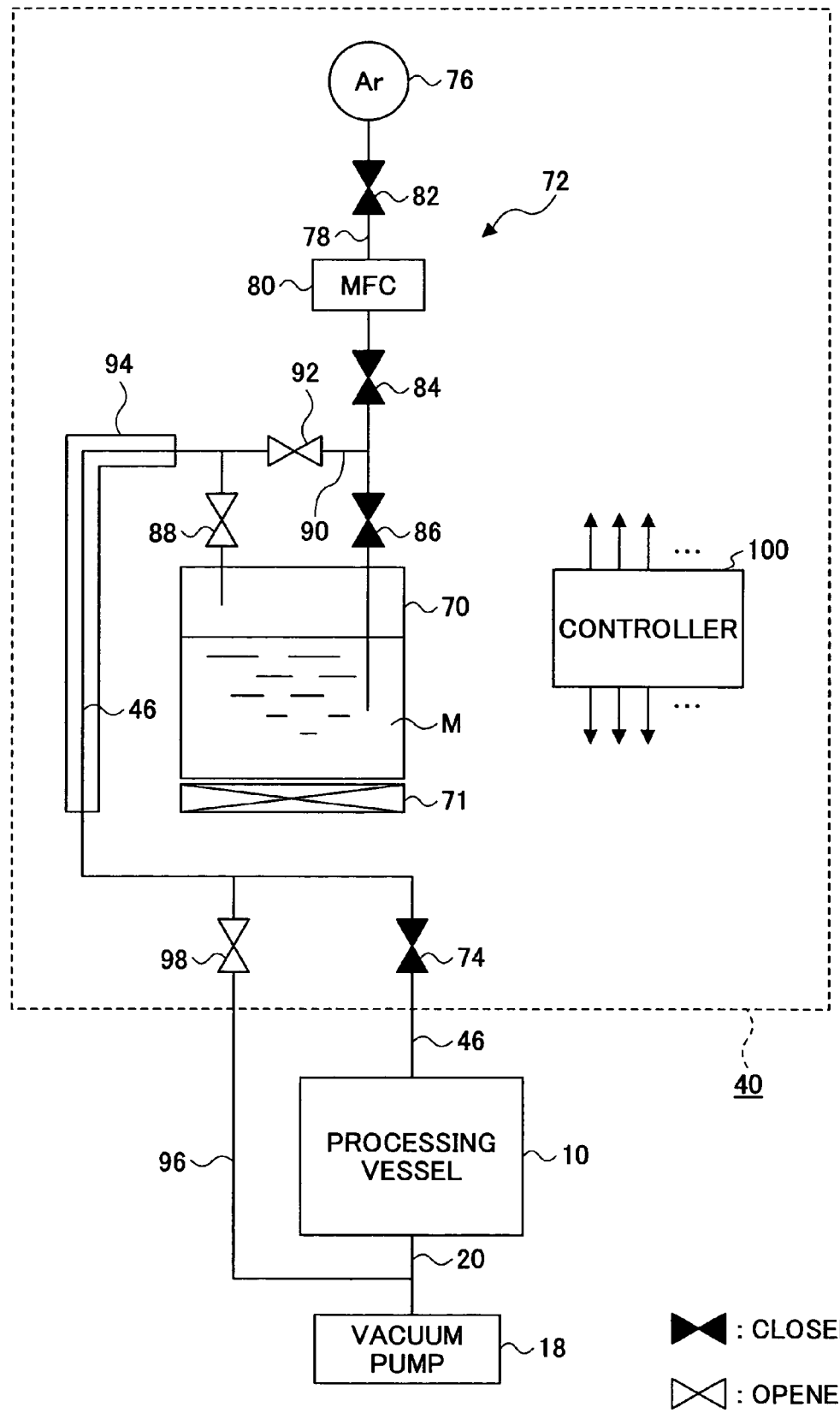
FIG. 5 is a diagram showing a state inside the source gas supply part according to an embodiment of the present invention.

As shown in FIG. 5, the valves 82, 84 and 86 of the carrier gas supplying part 72 are closed in this source gas evacuation phase, while the main valve 88 of source gas supply line 46, the bypass valve 92 of the carrier gas bypass line 90 and the evacuation valve 98 of the evacuation bypass line 96 are opened. On the other hand, the inlet valve 74 of the source gas supply line 46 is maintained in closed state.

Next, purging of the bubbling line is carried out (Step B2). Here, it should be noted that the bubbling line includes a part of the source gas supply line 46 between the valves 88 and 74 and a part of the carrier gas supply line 78 between the valves 82 and 86 and enables connection of the gas supply lines 46 and 78 by the carrier gas bypass line 90.

By causing to flow the Ar gas from the Ar gas source 76 through this bubbling line (78, 90, 46), it is possible to expel the source gas remaining in the source gas supply line 46 almost completely.

Figure 6:
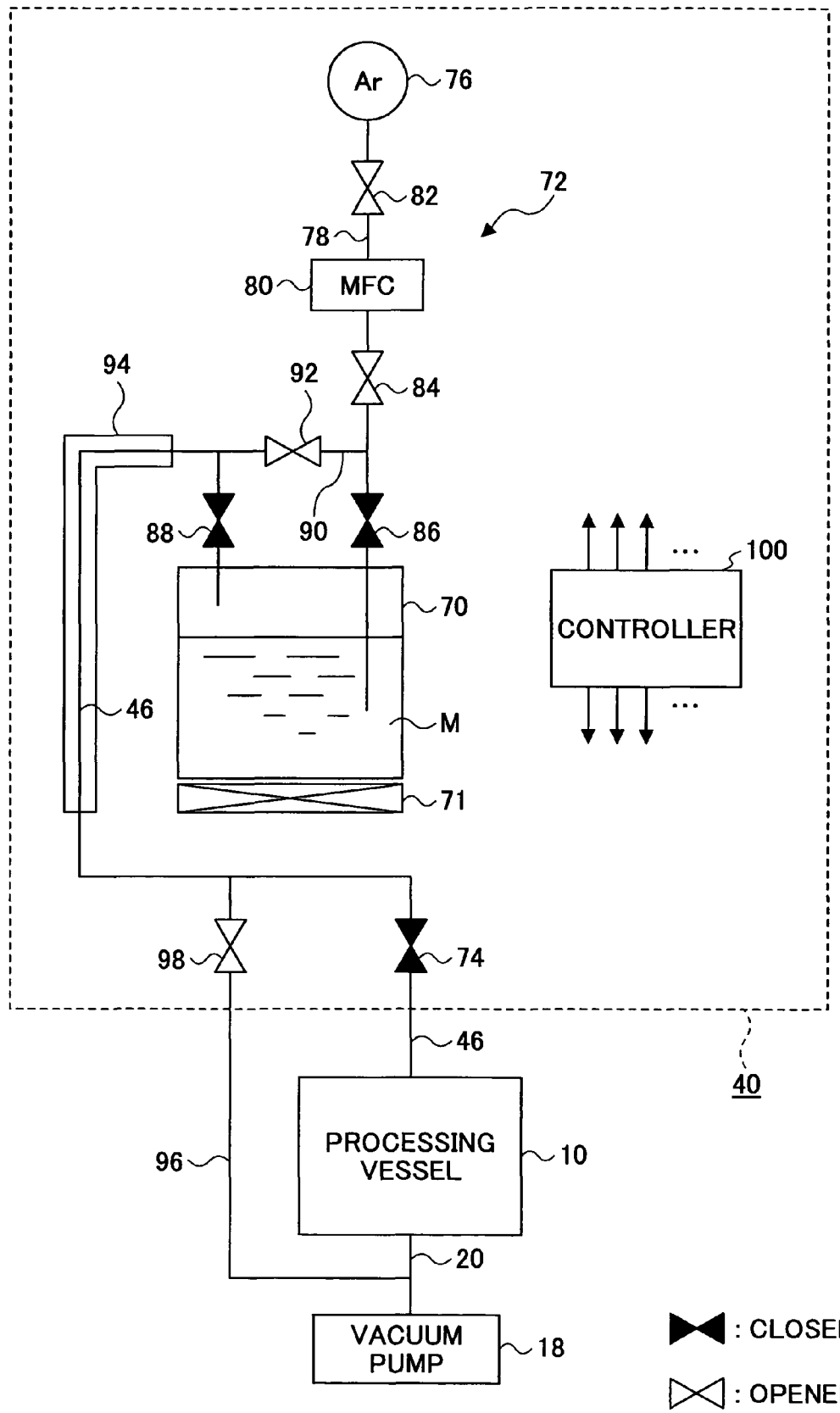
FIG. 6 is a diagram showing a state inside the source gas supply part according to an embodiment of the present invention.

Next, as shown in FIG. 6, the valves 82 and 84 are opened in the carrier gas supplying part 72 while the valve 86 is closed in this purging process. The flow rate control device (MFC) 80 may be adjusted to the highest flow rate value. Further, the main valve 88 of source gas supply line 46 and the inlet valve 74 are closed, and the bypass valve 92 of the carrier gas bypass line 90 and the evacuation valve 98 of and the evacuation bypass line 96 are opened.

Figure 7:
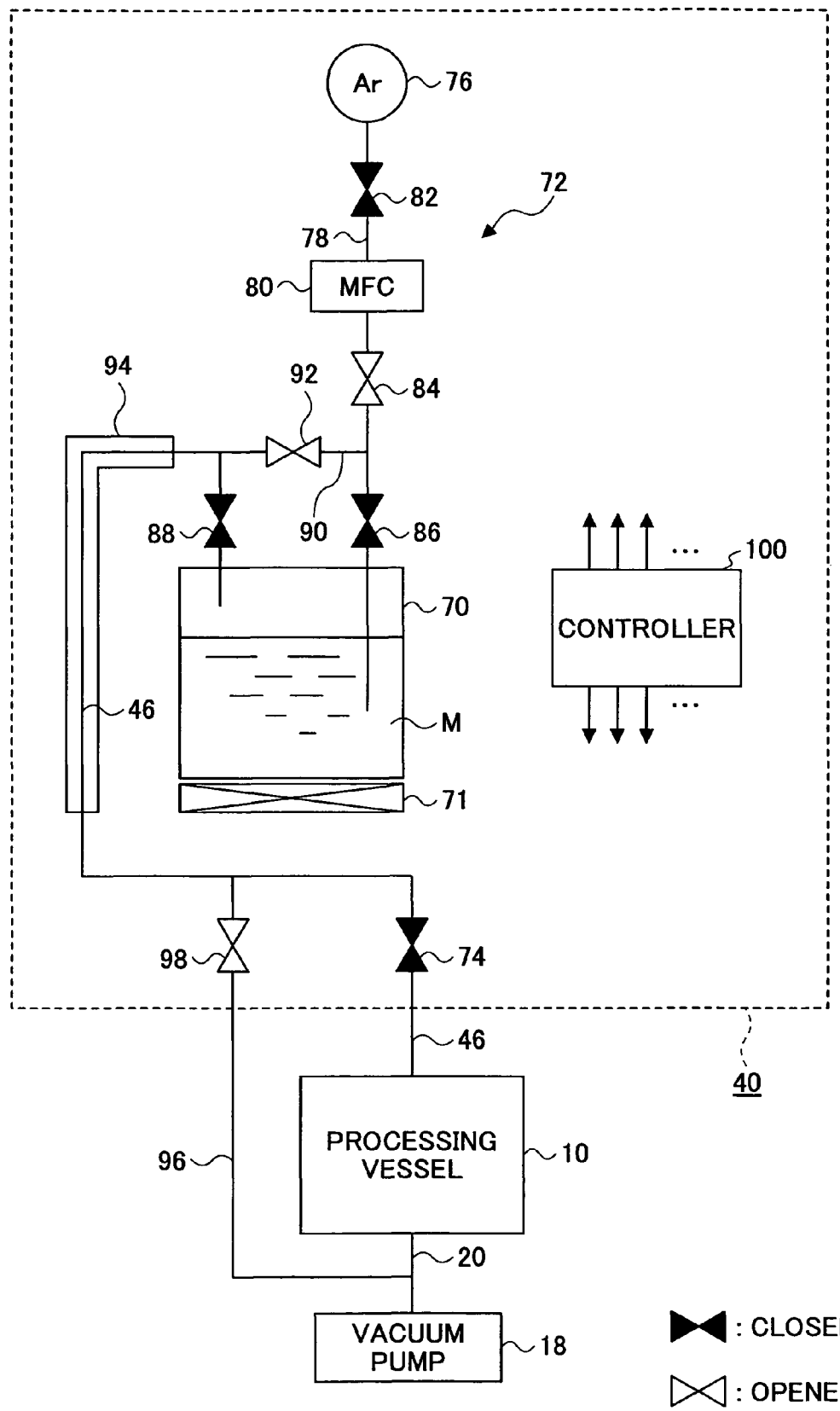
FIG. 7 is a diagram showing a state inside the source gas supply part according to an embodiment of the present invention.

After the foregoing purging process, the uppermost valve 82 of the carrier gas supply line 78 is closed as shown in FIG. 7, and vacuum evacuation of the bubbling line is carried out (Step B3). With this vacuum evacuation, the Ar gas remaining in the bubbling line is removed.

Figure 8:
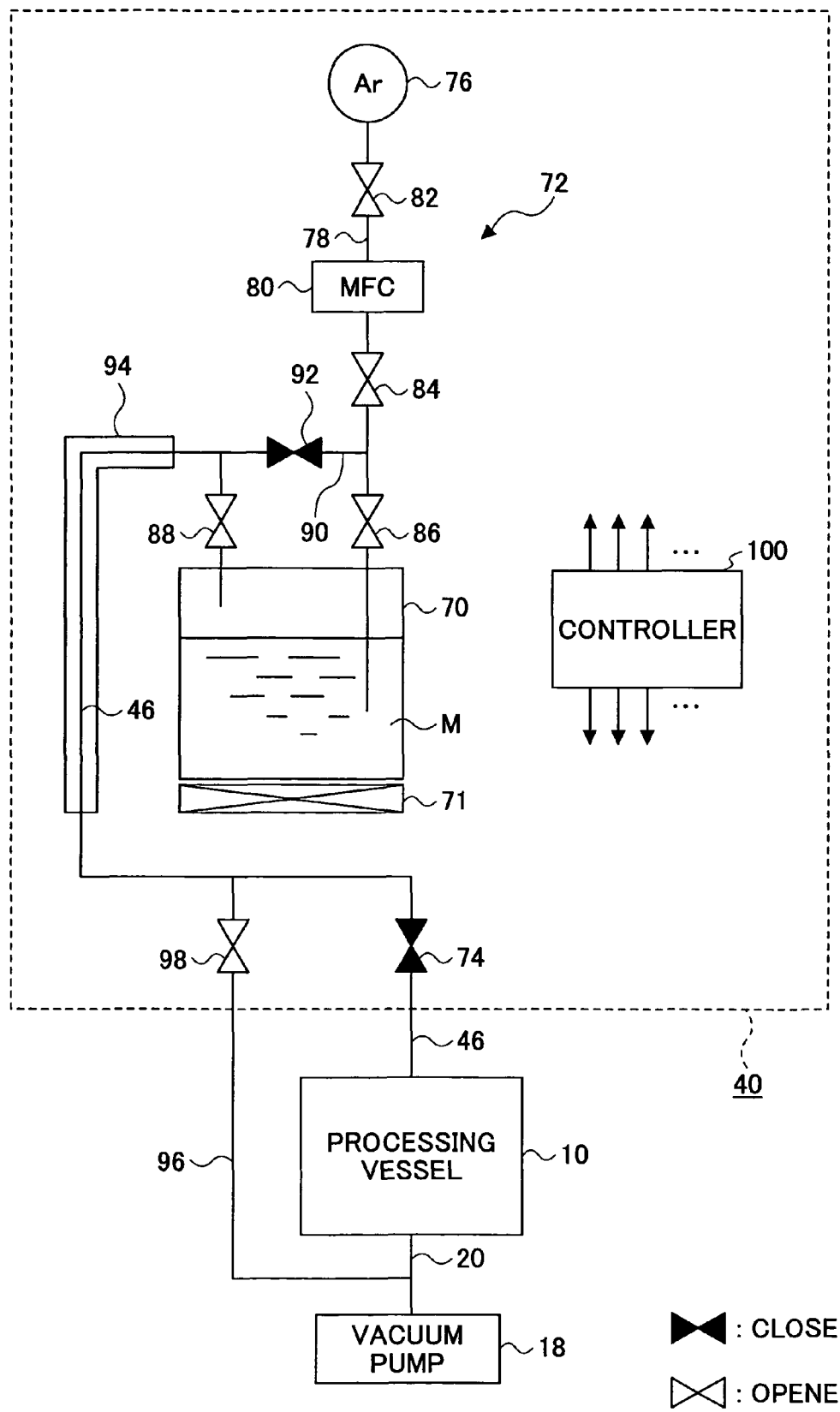
FIG. 8 is a diagram showing a state inside the source gas supply part according to an embodiment of the present invention.

Next, a predetermined gas is caused to flow with a predetermined flow rate in respective parts of the source gas supplying part 10 for stabilizing the bubbling line (Step B4). In order to achieve this stabilization, the bypass valve 92 of the carrier gas bypass line 90 is closed in the state of the vacuum evacuation (FIG. 7) and the bypass valve 92 of the carrier gas bypass line 90 is closed. Further, in place thereof, the uppermost valve 82 and the lowermost valve 86 Carrier gas supply line 78 and the main valve 88 of the source gas supply line 46 are opened (FIG. 8). Thereby, the evacuation valve 98 is maintained to the opened state and the inlet valve 74 is maintained to the closed state.

With this, the Ar gas from the carrier gas supplying part 72 is supplied to the source vessel 70 with a controlled flow rate controlled by the flow rate control device (MFC) 80 and causes bubbling of the solid source material M (TaCl$_5$) within the source vessel 70. The source gas (TaCl$_5$ gas) produced by sublimation or evaporation of the solid source material M (TaCl$_5$) is then supplied to the source gas supply line 46 with the Ar gas, and is discharged to the vacuum evacuation part 18 from the source gas supply line 46 through the evacuation bypass line 96.

It should be noted that the production rate of the source gas (TaCl$_5$ gas) in the source vessel 70 relies primarily on the flow rate of the carrier gas (Ar gas) and the temperature of the source material, wherein with regard to the short time response in terms of seconds, the flow rate of the carrier gas becomes a prominent parameter for controlling the source gas production.

Figure 9:
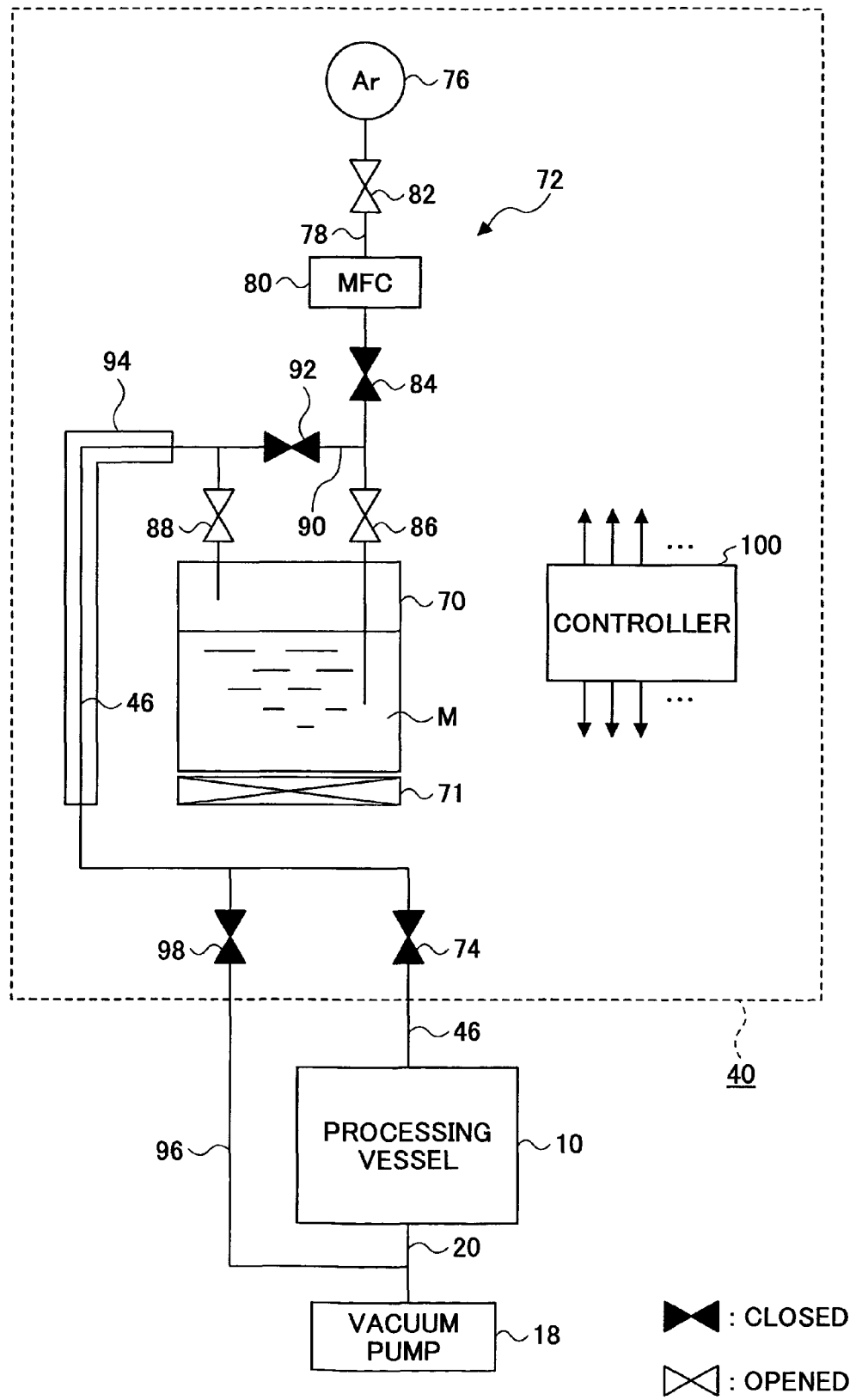
FIG. 9 is a diagram showing a state inside the source gas supply part according to an embodiment of the present invention.

Foregoing stabilization of the bubbling line is carried out over a predetermined time interval, while when this is completed, the intermediate valve 84 of the carrier gas supplying part 72 and the evacuation valve 98 of the evacuation bypass line 96 are closed, and the operation is switched to the phase of source gas filling (step B5) (FIG. 9).

In the source gas filling phase (B5), the flow path of the source gas (TaCl$_5$ gas) inside the source gas supply line 46 is cut off upon closure of the evacuation valve 98 of the evacuation bypass line 96. Further, with closure of the intermediate valve 84 of the carrier gas supplying part 72, supply of the Ar gas from the carrier gas supplying part 72 is stopped and thus the bubbling inside the source vessel 70.

As a result of this, a predetermined quantity of the source gas (TaCl$_5$ gas) fills the part of the source gas supply line 46 located at the upstream side of the inlet valve 74 and also the gas space inside the source vessel 70 in the state in which production of the source gas (TaCl$_5$ gas) in the source vessel 70 is stopped substantially. It should be noted that this source gas filling phase continues until the ALD film formation processing is started with the thin film formation apparatus.

Upon commencement of the ALD film formation processing, the operational phase of the source gas supplying part 40 is switched to the source gas supplying phase (step B6) in correspondence to the source gas supply step (A3) of the single-wafer ALD film formation processing (FIG. 2) noted before. Otherwise, the source gas supplying part 40 maintains the source gas filling phase (step B7). This switching of the phases (steps B6 and B7) is carried out repeatedly during the ALD processing of a single wafer for a predetermined number of times (ns) (Steps B8, B9, B10). In one lot, the foregoing predetermined number (ns) of single-wafer processing are further repeated over a predetermined number of times (ms) corresponding to the number of the wafers (Steps B11, B12, B13).

Figure 10:
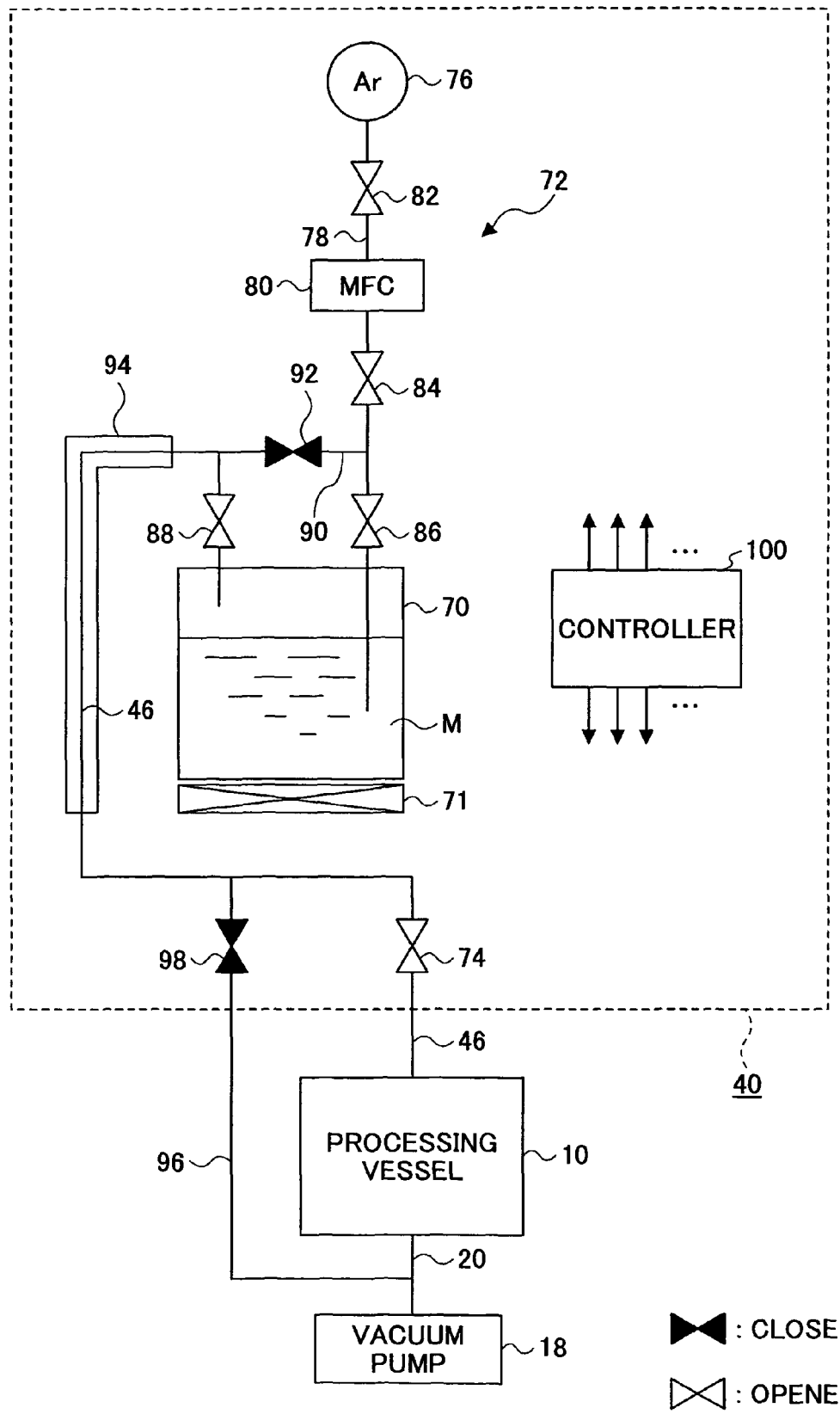
FIG. 10 is a diagram showing a state inside the source gas supply part according to an embodiment.

In the source gas supplying phase (B6), the valves 82, 84 and 86 of the carrier gas supplying part 72 and the main valve 88 and the inlet valve 74 of the source gas supply line 46 are opened and the evacuation valve 98 of evacuation bypass line 96 is closed as shown in FIG. 10.

With this, the source gas (TaCl$_5$ gas) filling the source gas supplying part 40, especially the part of the source gas supply line 46 in the upstream side of the inlet valve 41 and the gas space inside the source vessel 70 in the source gas filling phase (B5 or B7), is rushed into the processing vessel 10 through the inlet valve 74 set to the opened state. Thereby, it should be noted that the source gas (TaCl$_5$ gas) is pulled forward (sucked) to the processing vessel 10 by the negative pressure thereof and at the same time pushed by the carrier gas supplying part 72 behind with the pressure of the Ar gas.

Further, bubbling is resumed in the source vessel 70 and a newly formed source gas (TaCl$_5$ gas) is supplied also to the processing vessel 10 through the source gas supply line 46.

It should be noted that the stationary state of the source gas filling phase (B7) in the ALD cycle is identical to the source gas filling phase (B5) in the preparation period noted above, and the intermediate valve 84 of the carrier gas supplying part 72 and the inlet valve 74 of the source gas supply line 46 are closed as shown in FIG. 9.

Figure 11:
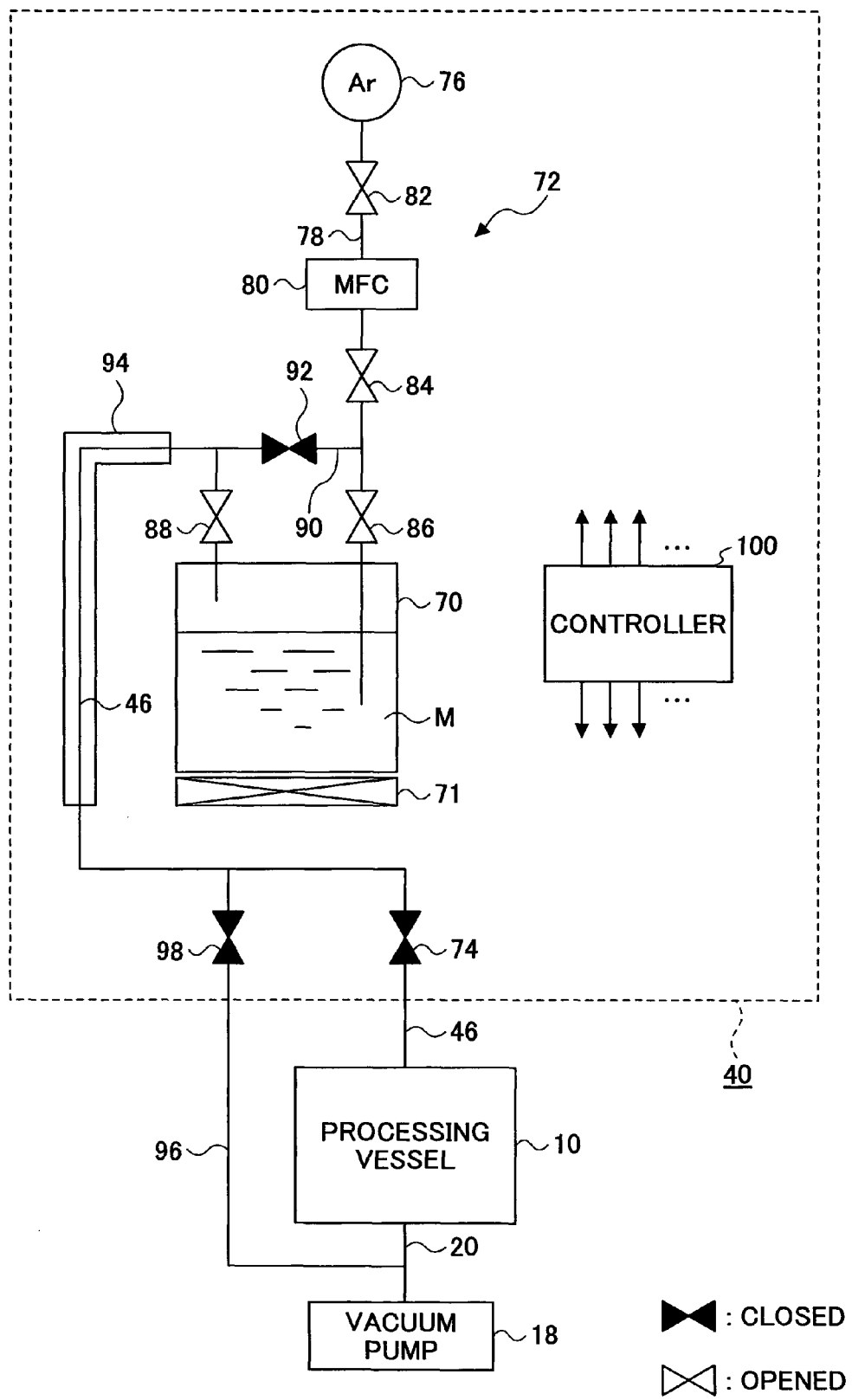
FIG. 11 is a diagram showing a state inside the source gas supply part according to an embodiment of the present invention.

According to a first method of the present invention, the valve 84 of the carrier gas supplying part 72 is kept opened for a while after the state of the inlet valve 74 has been switched from the opened state to the closed state immediately after the transition from the source gas supplying phase to the source gas filling phase (FIG. 10) as shown in FIG. 11, and supply of the Ar gas is continued to the source vessel 70. Thereby, stock of the source gas is earned for the next source gas supply step. Thus, the source gas (TaCl$_5$ gas) formed in the source vessel 70 in the source gas filling phase (B5) is filled or accumulated in the part of the source gas supply line 46 at the upstream side of the inlet valve 74 and in the gas space inside source vessel 70. Because the source gas (TaCl$_5$ gas) thus accumulated is heated to a predetermined temperature with the heater 94, there occurs no condensation.

Thus, upon commencement of the next source gas supply step (A3, B6), the accumulated source gas (TaCl$_5$ gas) rushes into the processing vessel 10 through the opened inlet valve 74.

Thus, with this embodiment, the source gas supplying part 40 rushes out the source gas hither to accumulated in the source vessel 70 and the source gas supply line 46 in the source gas supply step (A3, B6) and causes the source gas to flow into the processing vessel 10.

Thereby, while it is not guaranteed that source gas fills the processing vessel 10 with a constant flow rate, this does cause a problem in ALD.

In ALD, there occurs a saturation state once the source material molecules are absorbed to the substrate surface and an atom level layer is formed in the step of supplying the source gas. Thereby, further source material molecules become surplus. Only what is needed is that the total amount (time integral of flow rate) of the supplied source gas exceeds a predetermined quantity needed to cause the saturation state of adsorption, and there is no need of flow rate control of the gas.

Figure 12:
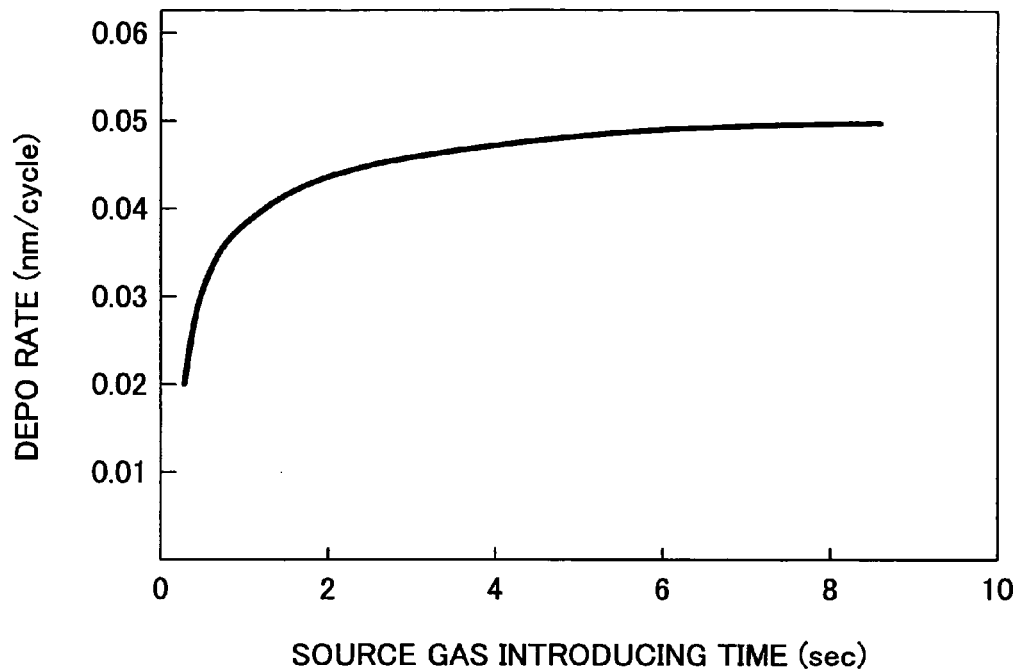
FIG. 12 is a diagram showing a film formation rate according to an ALD process of the present invention.

FIG. 12 shows an example of formation rate of a Ta film by introducing the source gas (TaCl$_5$ gas) into the processing vessel 10 with a predetermine flow rate. In the drawing, it should be noted that the source gas introduction time represents the tome for a single step and defines the quantity of the source gas introduced in one step. As can be seen in the drawing, there occurs saturation in the film formation rate with introduction of the gas for only several seconds.

In this example, it is possible to use the term "gas flow rate (constant value)×saturation time" as being the necessary source gas supply quantity for one step. In the case the flow rate of the source gas is not constant as in the case of the present embodiment, it is sufficient to simply design such that the total quantity (time integral) of the supplied source gas exceeds a need quantity of the ALD process.

According to the first method of the present invention, the source gas produced in the source tank 70 during the ALD film formation processing is supplied to the processing vessel 10 in the source gas supplying step (A3, B6) as shown above. Otherwise the source gas is accumulated or stored in the source gas supplying part 40 with the source gas filling phase (B5). Thereby, the source gas is no longer wasted by flowing to the evacuation bypass line 96.

Generally, the proportion of the source gas supplying duration in an ALD film formation processing is several ten percent or less. Thus, there is a very large difference in the consumption of the source material between the case the source gas is wasted to the evacuation part during the non-film formation interval and the case in which the source gas is stored in the source gas supply system.

According to the present invention, significant saving of the source material is thus realized.

Further, by closing the evacuation valve 98 of the evacuation bypass line 96 during the ALD film formation processing with the present invention, wear of the evacuation valve 98 is reduced and the lifetime thereof can be extended.

In ALD, it should be noted that the foregoing ALD cycle (steps A3-A6) is repeated several ten times in the film formation processing conducted for one wafer, while in the film formation processing conducted for one lot, such a cycle is repeated several hundreds times to several thousand times. Thereby, the inlet valve of the source gas supply system carries out the open and close operations with the same number as the ALD cycles, and thus, the inlet valve is one of the components that is subjected to severest wear or degradation. The inlet valve 74 of the present invention is no exception.

In the conventional ALD apparatuses, the evacuation valve of the evacuation bypass line performs the open and close operations with the same number or frequency as the inlet valve, and thus, the evacuation valve has also been a component subjected to severest degradation, while the present invention increases the lifetime of the evacuation valve 98 of the evacuation bypass line 96 as noted above. This provides definite advantage in regard to maintenance cost.

According to a second method of the present invention, all the valves 82, 84 and 86 of the carrier gas supplying part 72 are opened during the source gas filling phase as shown in FIG. 11, and the flow rate control function of the flow rate control device (MFC) 80 is used.

For example, the Ar gas flow rate is maintained for a while in the flow rate control device (MFC) 80 after the operational phase has been switched from the source gas filling phase to the source gas supplying phase wherein the Ar gas flow rate is set to zero after a predetermined time Td. With this, it is possible to obtain the result similar to the first method noted above. Alternatively, it is also possible to continue flowing the Ar gas with an arbitrary flow rate continuously or intermittently during the source gas filling phase.

Figure 13:
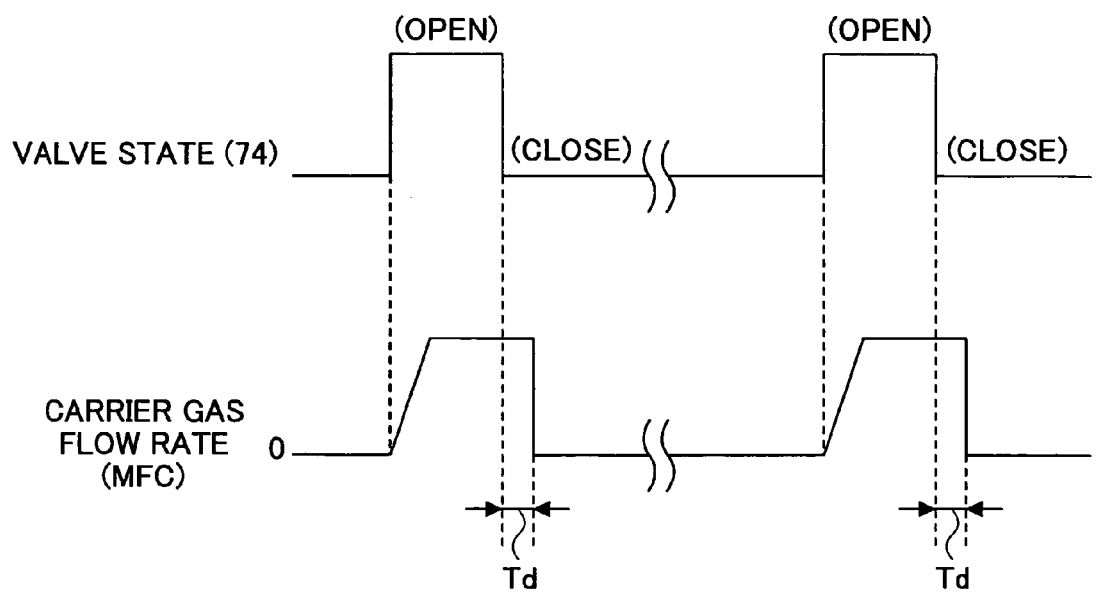
FIG. 13 is a timing chart showing an example of carrier gas flow rate control according to an embodiment of the present invention.

According to this second method, there is no longer the need of carrying out the open and close operations of the valve 84 of the carrier gas supplying part 72 in each ALD cycle, and wear of the valve 84 can be decreased. Further, by increasing the Ar gas flow rate with a desired slope in the flow rate control device (MFC) 80 at the time of commencement of the source gas supply step (A3, B6), as shown in FIG. 13, it is possible to start (resume) the bubbling or production of the source gas inside the source tank 70 with stability.

Figure 14:
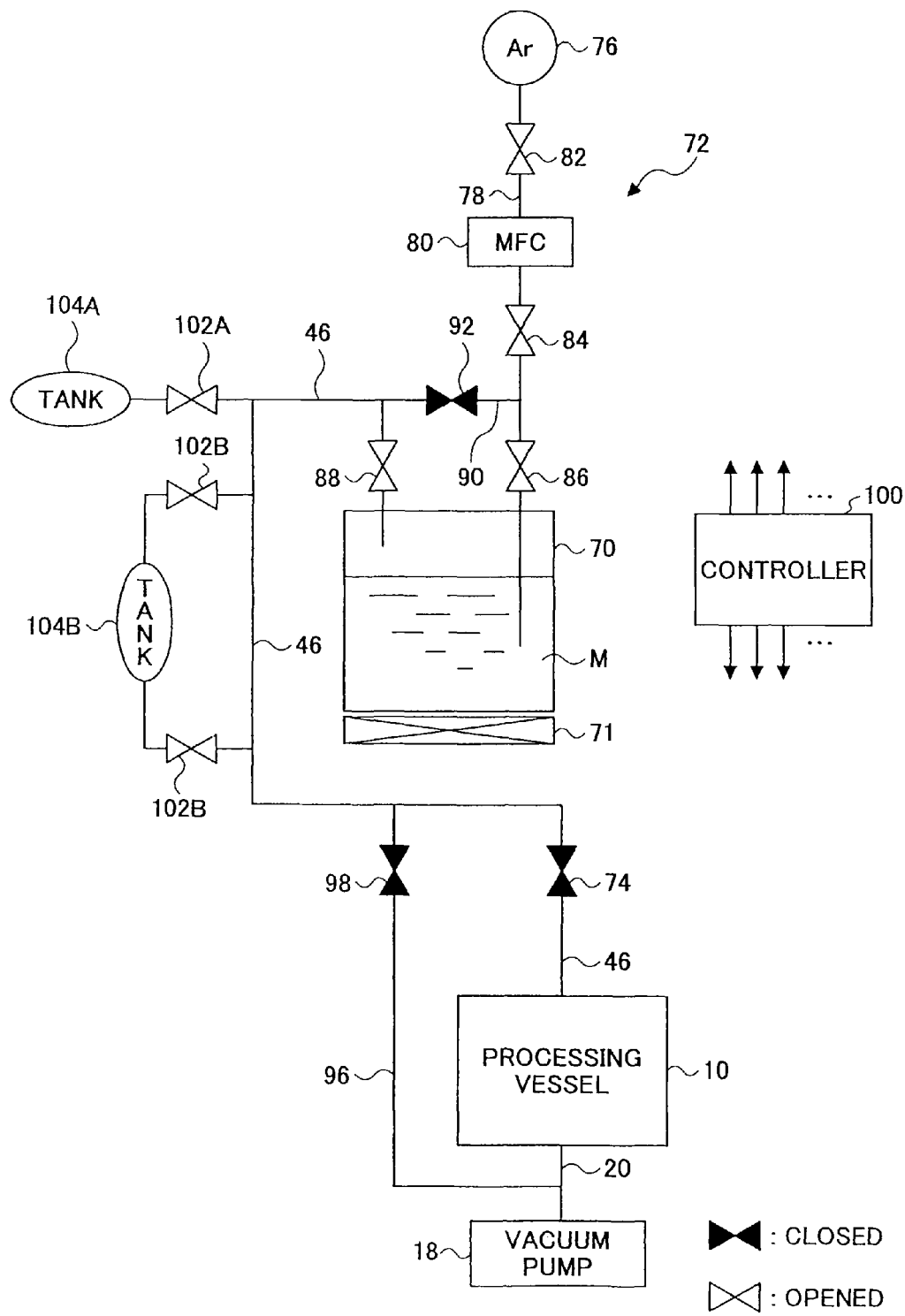
FIG. 14 is a diagram showing the construction of a source gas supply part according to a modification of the embodiment.

FIG. 14 shows a modification of the embodiment explained above, wherein it should be noted that this modification enables arbitrary expansion or switching of the capacity of the volume filled with the source gas in the source gas supplying part 40.

More specifically, one or more reserve tanks (104A, 104B, 104 . . . ) is connected to the source gas supply line 46 at the upstream side of the inlet valve 74 as shown in FIG. 14. Each of the open/close valves 102 is opened at the time of using a corresponding reserve tank 104 and may be operated manually. Thereby, each reserve tank 104 operates to suck the source gas (TaCl$_5$ gas) from high pressure side (the side of the source vessel 70) in the source gas filling phase and discharges the source gas to the low pressure side (the side of the processing vessel 10) in the source gas supplying phase. Thereby, it is possible to switch the reserve tanks 104 selectively according to the type of the source material or processes.

Figure 15:
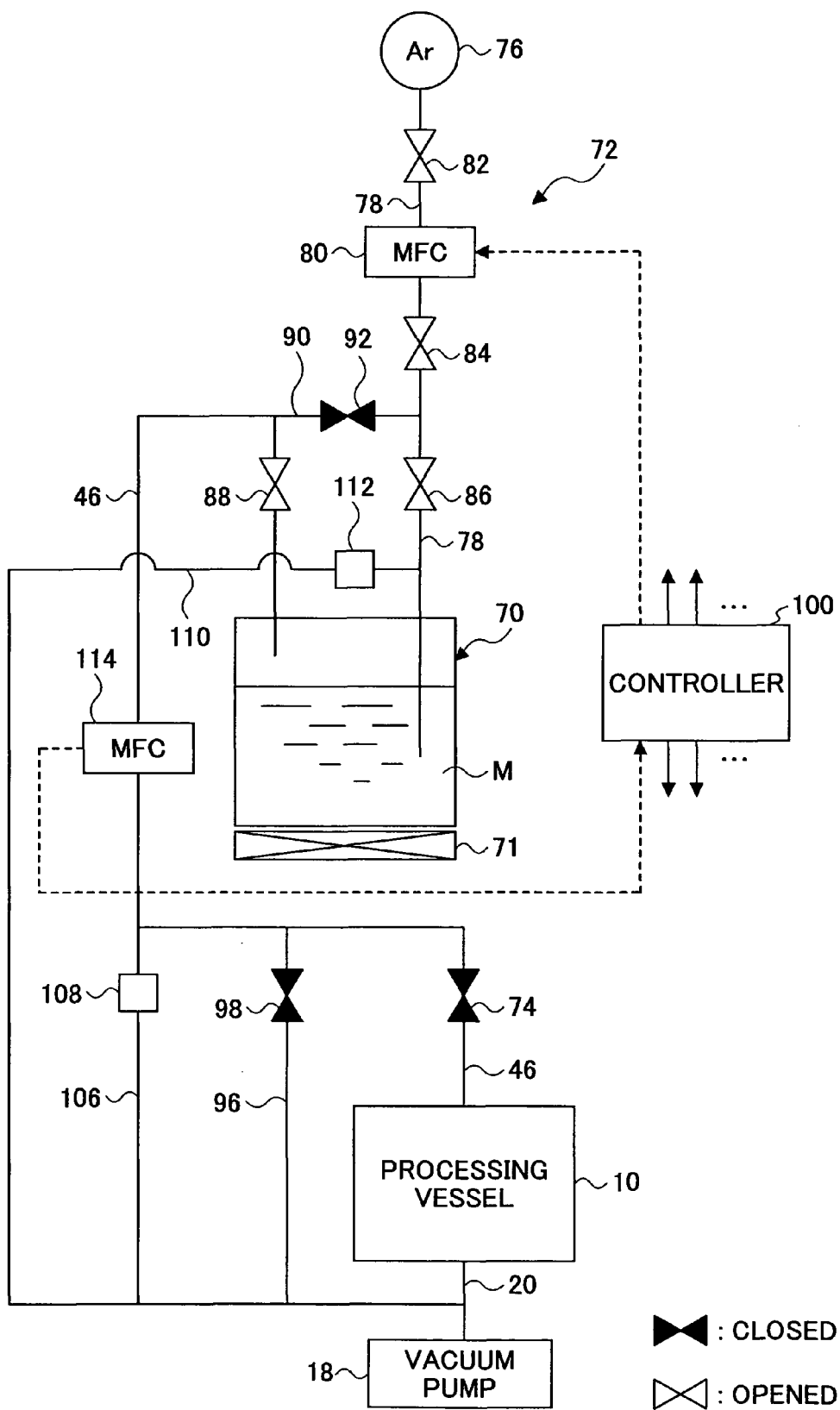
FIG. 15 is a diagram showing the construction of the source gas supply part according to a different embodiment.

FIG. 15 shows the construction of the source gas supplying part 40 according to another embodiment wherein it should be noted that this embodiment includes two features.

One such feature is to provide the means for preventing the pressure to become excessively high in various parts of the source gas supplying part 40 during the source gas filling phase. When the pressure of the source gas increases excessively in the source gas filling phase, condensation (liquefaction/solidification) of the source material would be invited.

Thus, in the illustrated example, an evacuation bypass line 106 communicating to the vacuum evacuation part 18 is connected to the source gas supply line 46 at the upstream side of the inlet valve 74, and a relief valve 108 is provided to this evacuation bypass line 106. When the pressure inside the source gas supply line 46 exceeds the predetermined value, this relief valve 108 is operated and the source gas is released to the vacuum evacuation part 18 for avoiding the pressure increase.

Further, according to the illustrated example, there is connected an evacuation bypass line 110 communicating to the vacuum evacuation part 18 to the end part of the carrier gas supply line 78 at the downstream side, and a relief valve 112 is provided to this evacuation bypass line 110.

Generally, the carrier gas supplying part 72 has a construction to heat the carrier gas supply line 78 or the valves 84 and 86 at the downstream side to a constant temperature so as to avoid the source gas flowing backward from the source vessel 10 to cause condensation (liquefaction/solidification) in the carrier gas supply line 78, while it is not possible to heat the flow rate control device (MFC) 80.

Therefore, with regard to the flow rate control device (MFC) 80, it is preferable to cause the carrier gas to flow to the downstream side continuously. However, there is a risk that condensation (liquefaction/solidification) of the source material occurs inside the source vessel 70 or in the source gas supply line 46 when the pressure inside the source vessel 70 goes up beyond a predetermined limit as in the case of carrying out the source gas filling phase over a long time.

In the illustrated example, the relief valve 112 operates when the pressure inside the carrier gas supply line 78 has exceeded a predetermined value between the source vessel 70 and the flow rate control device (MFC) 80, and the carrier gas is released to the vacuum evacuation part 18. Thereby, excessive pressure increase is prevented.

Another feature of the apparatus of FIG. 15 is that, in order to adapt the apparatus so as to be applicable to ordinary CVD processes, there is provided a flow meter (MFM) 114 in the source gas supply line 46. Thereby, the inlet valve 74 is kept open in general CVD process, and the source gas is supplied to the processing vessel 10 with a constant flow rate. The flow meter (MFM) 114 measures the flow rate of the mixed gas (source gas/carrier gas mixture) flowing through the source gas supply line 46 and provides the flow rate measured value to the controller 100.

Now, because the controller 100 controls or grasps the flow rate of the carrier gas through the flow rate control device (MFC) 80, it is possible to monitor the flow rate of the source gas formed in the source vessel 10 from the flow rate value of the mixture gas measured with the flow meter (MFM) 114 and the carrier gas flow rate preset value instructing to the flow rate control device (MFC) 80. More specifically, the measured value of the source gas flow rate (monitor value) is obtained by subtracting the carrier gas flow rate preset value from the measured value of the mixture gas flow rate.

As noted before, with the source gas supplying part 40 of the present embodiment, the source gas and the carrier gas are supplied to the source gas supply line 46 and the evacuation bypass line 96 similarly to the time of the film formation processing in advance of the film formation processing for stabilizing the bubbling line (Step 4).

During this stabilization process of the bubbling line, the controller 100 can perform calculation, control and stabilization of the source gas flow rate by monitoring through the flow meter (MFM) 114 and the flow rate control device (MFC) 80. Thereby, it becomes possible to supply the source gas to the processing vessel 10 with a constant preset flow rate at the time of the CVD film formation processing based on the obtained monitoring information and control information.

At the time of the CVD film formation processing, it should be noted that not only the source gas from the source gas supplying part 40 is introduced into the processing vessel 10 but also the reaction gas (reducing gas, for example) from the reaction gas supply part (reducing gas supplying part 42, for example) with a predetermined flow rate.

Like this, the source gas supplying part 40 of the present embodiment can be switched arbitrarily between the phase of supplying the source gas to the processing vessel 10 intermittently for the ALD process and the phase of supplying the source gas continuously for the CVD process.

Thus, with the thin film formation apparatus having the source gas supplying part 40, it is possible to carry out the film formation processing by arbitrarily switching the film formation processing between ALD process and CVD process, and thus, it is possible to switch the sequence of ALD and the sequence of CVD consecutively or alternately in a single film formation process for a single substrate, for example.

Further, various other modifications are possible within the scope of the present invention.

For example, it is possible to combine the constituting elements of FIG. 14 with the constituting elements of FIG. 15 as desired.

The present invention is applicable to advantageously to an ALD process as noted above, and thus, it is possible to apply the present invention to an ALD process in which three or more reaction gases are introduced into the processing vessel with different steps.

With regard to the plasma source in PEALD process, it is possible to use various constructions other than parallel plate type explained in the embodiment, such as ICP (induction coupled plasma), RLSA (radial line slot antenna), and the like.

Further, the substance for the source material is not limited to $TaCl_5$ explained in the embodiment but it is also possible to use a halogen metal compound such as $TaF_5$ (tantalum pentafluoride) or metal organic compound. Further, the present invention is applicable to formation of insulation films.

Further, the substrate of the present invention is not limited to a semiconductor wafer but the present invention is applicable to a glass substrate, or the like, for a flat display panel.

The present invention is based on Japanese priority application 2004-233170 filed on Aug. 10, 2004, the entire contents of which are incorporated herein as reference.

What is claimed is:

1. A thin film formation apparatus that introduces, in a first operational phase thereof, a source gas into a processing vessel capable of being evacuated and accommodating therein a substrate to be processed, and forms a thin film on said substrate by causing a reaction in said introduced source gas, comprising:
    a source gas producing part producing said source gas by vaporizing a source material of solid or liquid;
    a carrier gas supply part supplying a carrier gas to said source gas producing part;
    a source gas supplying line extending directly from an outlet of said source gas producing part to said processing vessel, said source gas supplying line causing said source gas produced in said source gas producing part to flow to said processing vessel;
    a first open/close valve provided on said source gas supplying line, said first open/close valve taking an opened state in said first operational phase; and
    a plurality of reserve tanks connected to said source gas supplying line via a line branched out and separate from said source gas supplying line, said reserve tanks configured to suck said source gas in an interval in which said first open/close valve is in a closed state and discharge said source gas when said first open/close valve has become said open state,
    wherein said thin film formation apparatus is configured to adjust a volume of said source gas filled in said source gas supplying line at a part upstream side to said first open/close valve, by selectively switching said plurality of reserve tanks,
    wherein said thin film formation apparatus carrying out an atomic layer deposition process, by carrying out said first operational phase, a first purging process for purging said processing vessel after said first operational phase, a second operational phase of supplying a reducing gas to said processing vessel after said first purging process, and a second purging process for purging said processing vessel after said second operational phase, and
    wherein the source gas supplying line extending directly from the outlet of the source gas producing part to said processing vessel does not pass through any of the plurality of reserve tanks.

2. The thin film formation apparatus as claimed in claim 1, wherein said carrier gas supply part comprises:
    a carrier gas source supplying said carrier gas;
    a carrier gas supply path forwarding said carrier gas from said carrier gas source to said source gas producing part; and
    a second open/close valve provided to said carrier gas supply path.

3. The thin film formation apparatus as claimed in claim 2, wherein said carrier gas supply part controls an open/close operation of said second open/close valve in connection with an open/close operation of said first open/close valve.

4. The thin film formation apparatus as claimed in claim 3, wherein said second open/close valve is switched from a closed state to an opened state substantially simultaneously to a switching operation of said first open/close valve from a closed state to an opened state, and wherein said second open/close valve is switched from said opened state to said closed state after a predetermined time has elapsed from the switching of said first open/close valve from said closed state to said opened state.

5. The thin film formation apparatus as claimed in claim 2, wherein said carrier gas supply part causes an open/close operation in said second open/close valve without synchronization with an open/close operation of said first open/close valve.

6. The thin film forming apparatus as claimed in claim 2, wherein a second evacuation path is connected to said carrier gas supply path for evacuation and there is provided a second pressure release unit to said second evacuation path for releasing said carrier gas when a pressure inside said carrier gas supply path has exceeded a predetermined value.

7. The thin film forming apparatus as claimed in claim 2, wherein said source gas producing part includes a source vessel accommodating therein a solid source material or liquid source material, said source vessel communicating with said carrier gas supply path and said source gas supplying line.

8. The thin film forming apparatus as claimed in claim 2, wherein a third evacuation path for evacuation is connected to said source gas supplying line and a third open/close valve is provided to said third evacuation path such that said third open/close valve is opened when discarding said source gas produced in said source gas producing part without supplying said source gas to said processing vessel.

9. The thin film forming apparatus as claimed in claim 1, wherein said carrier gas supply part comprises:
 a carrier gas source supplying a carrier gas;
 a carrier gas supply path for supplying said carrier gas from said carrier gas source to said source gas producing part; and
 a flow rate control device provided to said carrier gas supply path.

10. The thin film formation apparatus as claimed in claim 9, wherein said carrier gas supply part operates said flow rate control device such that a flow rate of said carrier gas is changed in connection to open/close operation of said first open/close valve.

11. The thin film forming apparatus as claimed in claim 10, wherein said flow rate control device decreases a flow rate of said carrier gas with a predetermined delay time at the time of switching of said first open/close valve from an opened state to a closed state such that said flow rate of said carrier gas is increased with a predetermined slope at the time of switching of said first open/close valve from said closed state to said opened state.

12. The thin film forming apparatus as claimed in claim 9, wherein said carrier gas supply part controls an operation of said flow rate control device such that a flow rate of said carrier gas is controlled independently to an open/close operation of said first open/close valve.

13. The thin film forming apparatus as claimed in claim 1, wherein a first evacuation path is connected to said source gas supplying line for evacuation and there is provided a first pressure release unit is in said first evacuation path for releasing said source gas when a pressure inside said source gas supplying line has exceeded a predetermined value.

14. The thin film forming apparatus as claimed in claim 1, wherein there is provided a heating part heating said source gas supplying line for preventing condensation of the source gas.

15. The thin film forming apparatus as claimed in claim 1, wherein said first phase is repeated plural times with a predetermined time interval.

16. The thin film forming apparatus as claimed in claim 1, wherein said source gas introduced into said processing vessel in said first phase is absorbed on said substrate with a predetermined quantity.

17. The thin film forming apparatus as claimed in claim 16, wherein there is provided a purge gas supplying part for supplying a purge gas to said processing vessel for discharging excess source gas in a second phase immediately after said first phase.

18. The thin film forming apparatus as claimed in claim 17, wherein there is provided a first reaction gas supplying part supplying a first reaction gas in a third phase immediately following said second phase to the processing vessel for causing reaction with said source gas that has been absorbed on said substrate.

19. The thin film forming apparatus as claimed in claim 18, wherein said purge gas supplying part supplies a purge gas to said processing vessel for discharging said excess reaction gas in a fourth phase immediately after said third phase.

20. The thin film forming apparatus as claimed in claim 1, wherein there is provided a second reaction gas supply part for supplying a second reaction gas reactive with said source gas to said processing vessel, such that said first open/close valve is opened in a fifth phase and said source gas is introduced into said processing vessel from said source gas producing part and such that said second reaction gas is introduced from said second reaction gas supply part simultaneously, said second reaction gas thereby causing a reaction with said source gas.

21. The thin film forming apparatus as claimed in claim 20, wherein there is provided a gas flow rate control unit controlling a flow rate of said carrier gas supplied to said source gas producing part from said carrier gas supply part, such that said source gas is introduced to said processing vessel with a desired flow rate in said fifth phase.

22. The thin film forming apparatus as claimed in claim 21, wherein said gas flow rate control unit comprises:
 a flow meter for measuring a flow rate of a mixture gas of said source gas and said carrier gas flowing through said source gas supplying line; and
 a source gas flow rate processing part for obtaining a flow rate of said source gas flowing through said source gas supplying line based on said flow rate measurement value from said flow meter and said flow rate of said carrier gas supplied to said source gas producing part from said carrier gas supplying part.

23. The thin film formation apparatus as claimed in claim 1, wherein said carrier gas supply part includes a second open/close valve that operates together with said first open/close value, said second open/close valve supplying said carrier gas to said source gas producing part or interrupting a supply of said carrier gas to said source gas producing part.

24. The thin film formation apparatus as claimed in claim 23, wherein said carrier gas supply part includes a flow rate controller that changes, in cooperation with said first open/close valve, a flow rate of said carrier gas supplied to said source gas producing part.

\* \* \* \* \*